United States Patent [19]
Schwartz et al.

[11] Patent Number: 6,094,151
[45] Date of Patent: Jul. 25, 2000

[54] APPARATUS AND METHOD FOR FINITE STATE MACHINE CODING OF INFORMATION SELECTING MOST PROBABLE STATE SUBINTERVALS

[75] Inventors: Edward L. Schwartz, Sunnyvale; Michael J. Gormish, Redwood City, both of Calif.

[73] Assignees: Ricoh Company, Ltd., Tokyo, Japan; Ricoh Corporation, West Caldwell, N.J.

[21] Appl. No.: 09/003,076

[22] Filed: Jan. 5, 1998

[51] Int. Cl.[7] .................................................. H03M 7/00
[52] U.S. Cl. ........................................ 341/107; 341/106
[58] Field of Search ............................. 341/51, 106, 107, 341/143; 714/799; 382/248, 232

[56] References Cited

U.S. PATENT DOCUMENTS

| | | | |
|---|---|---|---|
| 4,792,954 | 12/1988 | Arps et al. | 714/799 |
| 4,933,883 | 6/1990 | Pennebaker et al. | 341/107 X |
| 5,475,388 | 12/1995 | Gormish et al. | 341/107 |
| 5,555,323 | 9/1996 | Hongu | 382/247 |
| 5,583,500 | 12/1996 | Allen et al. | 341/51 X |
| 5,710,562 | 1/1998 | Gormish et al. | 341/107 |
| 5,717,394 | 2/1998 | Schwartz et al. | 341/51 |

*Primary Examiner*—Brian Young
*Assistant Examiner*—Patrick Wamsley
*Attorney, Agent, or Firm*—Blakely, Sokoloff, Taylor & Zafman LLP

[57] ABSTRACT

An FSM-coder hardware is described. In one embodiment, the present invention provides a method of encoding that includes creating an interval based on a finite state machine (FSM) state. The interval comprises a pair of subintervals having endpoints. The method also includes selecting one of the pair of subintervals based on whether the input bit is in a most probable state, and outputting zero or more bits corresponding to bits that match between endpoints of said one subinterval that occur from the most significant bits to, and not including, the first non-matching bits between the endpoints of said one subinterval.

19 Claims, 18 Drawing Sheets

6,094,151

APPARATUS AND METHOD FOR FINITE STATE MACHINE CODING OF INFORMATION SELECTING MOST PROBABLE STATE SUBINTERVALS

FIELD OF THE INVENTION

The present invention relates to the field of data encoding and decoding; more particularly, the present invention relates to data encoding and decoding with a finite state machine coder.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

In some compression systems, an input file or set of data is translated into a sequence of decisions under the direction of a decision model. Each decision has an associated likelihood, and based on this likelihood, an output code is generated and appended to the compressed file. To implement these encoding systems, compression systems have three parts: a decision model, a probability estimation method and a bitstream generator. The decision model receives the input data and translates the data into a set of decisions which the compression system uses to encode the data. The decision model is typically referred to as a context model. The probability estimation method is a procedure for developing the probability estimate for the likelihood of each decision. The bit-stream generator performs the final bit-stream encoding to generate the output code which is the compressed data set or compressed file. Compression can effectively occur in either or both the decision model and the bit generator.

A binary coder is one type of coding system that encodes data as a sequence of binary decisions.

Finite state machine coders are binary entropy coders that are well known in the art. A FSM-coder is a lossless multi-context binary entropy coder. Finite state machines are used for both bit generation (creating bitstreams given bits with known or assumed probabilities) and probability estimation (estimating probabilities based on past data from the same context). During encoding, the FSM-coder takes a series of bits with associated contexts and produces a coded bitstream that represents those bits with as little data as possible. During decoding, the FSM-coder takes the coded bitstream and the sequence of contexts and reproduces the original sequence of bits. An example of one is described in U.S. Pat. No. 5,272,478, entitled "Method and Apparatus for Entropy Encoding", issued Dec. 21, 1993. See also U.S. Pat. No. 5,475,388, entitled "Method and Apparatus for Using Finite State Machines to Perform Channel Modulation and Error Correction and Entropy Coding", issued Dec. 12, 1995.

Binary entropy coders can be used as the lossless coding portion of image compression systems. They allow the best possible compression by allowing symbols with probability greater than 50% to be coded and by permitting changing contexts (changing probability estimates) independently for each bit of the data to be compressed. Other binary entropy coders are the IBM Q-coder, the IBM/Mitsubishi QM-coder, and the ABS-coder, which is described in U.S. Pat. No. 5,381,145, entitled "Method and Apparatus for Parallel Encoding and Decoding of Data", issued Jan. 10, 1995, and U.S. Pat. No. 5,583,500, entitled "Method and Apparatus for Parallel Encoding and Decoding of Data", issued Jan. 10, 1996.

The FSM-coder is relatively fast and simple to implement in software. The FSM-coder is currently used in reversible wavelet-based image compression systems that the corporate assignee of the present invention has proposed for standardization.

SUMMARY OF THE INVENTION

An FSM-coder hardware is described. In one embodiment, the present invention provides a method of encoding that includes creating an interval based on a finite state machine (FSM) state. The interval comprises a pair of subintervals having endpoints. The method also includes selecting one of the pair of subintervals based on whether the input bit is in a most probable state, and outputting zero or more bits corresponding to bits that match between endpoints of said one subinterval that occur from the most significant bits to, and not including, the first non-matching bits between the endpoints of said one subinterval.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1A:
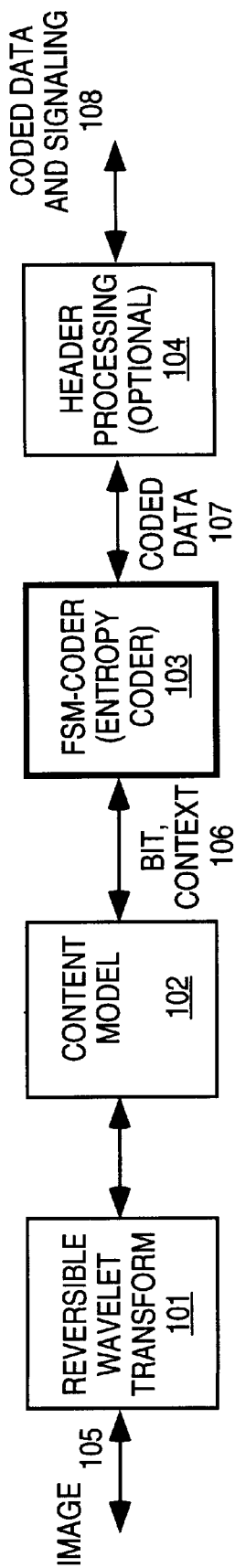
FIG. 1A is a block diagram of one embodiment of a compression/decompression system.

A portion of the disclosure of this patent document contains material which is subject to copyright protection. The copyright owner has no objection to the facsimile reproduction by anyone of the patent document or the patent disclosure, as it appears in the Patent and Trademark Office patent file or record, but otherwise reserves all copyright rights whatsoever.

An apparatus and method for finite state machine (FSM) coding is described. In the following description, numerous details are set forth, such as signal names, number of bits, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions described below are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also as discussed below, the present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magneto-optical disks, read-only memories (ROMs), random access memories (RAMs), EPROMs, EEPROMS, magnetic or optical cards, or any type of media suitable for storing electronic instructions, and each coupled to a computer system bus. The algorithms presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

The present invention provides a FSM coder and FSM-based coder system that is designed for improved performance. Certain implementations are more suitable for hardware or software or a combination of both.

The FSM-coder of the present invention may be the entropy coder used in a system employing compression with reversible wavelets. FIG. 1A is a block diagram of one embodiment of compression/decompression system of the present invention. Referring to FIG. 1A, image data 105 is input to or received from reversible wavelet transform 101, which includes both forward and inverse transforms. Transform 101 is coupled to context model 102. Context model 102 is also coupled to FSM-coder 103, which is also coupled to header processing unit 104. Header processing unit 104 generates or receives coded data and signaling 108. In one embodiment, coded data and signaling 108 comprises a tagged codestream. Thus, in addition to interfacing with context model 102, the coded data of FSM coder 103 is contained in a tagged codestream which is created/used by header processing unit 104.

The basic operation of the FSM coder-based system of FIG. 1A is as follows. During encoding, the input data, image data 105, is converted into a series of coefficients, each coefficient being multiple bits in length, by the forward reversible wavelet transform of transform 101. The bits of the coefficients from transform 101 are divided into context bins by context model 102. A probability estimate is stored for each context bin and is generated by a probability estimation machine (PEM) within FSM coder 103. In one embodiment, the estimate is a state that is similar to the value of a counter. In one embodiment, one bit of the state indicates if "0" or "1" is more likely to occur for the context bin. This is called the most probably symbol or MPS. The other bits indicate the skew (PSTATE) of the MPS (as opposed to the least probable symbol (LPS)), from close to 50% to close to 100%. In other words, the other bits indicate how likely the MPS is to occur (in comparison to the LPS).

State machine update rules described below specify what to do given a current state and an occurrence of a 0 or 1 in order to update the PSTATE and the bit which is more likely to occur for the context bin. In one embodiment, the rules specify only 10 bits per context to keep track of the MPS and PSTATE. In general, the rules cause the PSTATE to increase by some amount when a MPS occurs and to decrease by some amount when a LPS (least probable symbol) occurs. In one embodiment, the skew is divided into 16 probability classes (PCLASS). Each PCLASS is used for a range of probabilities.

FSM-coder 103 comprises a finite state machine that codes bits for each PCLASS. To code bits with probabilities greater than 50%, sometimes no bits are output and information is temporarily stored in the state of this finite state machine. This entropy coder state indicates which bit patterns can be output in the future so bits for which there has not yet been output will be understood correctly by the decoder.

Figure 1B:
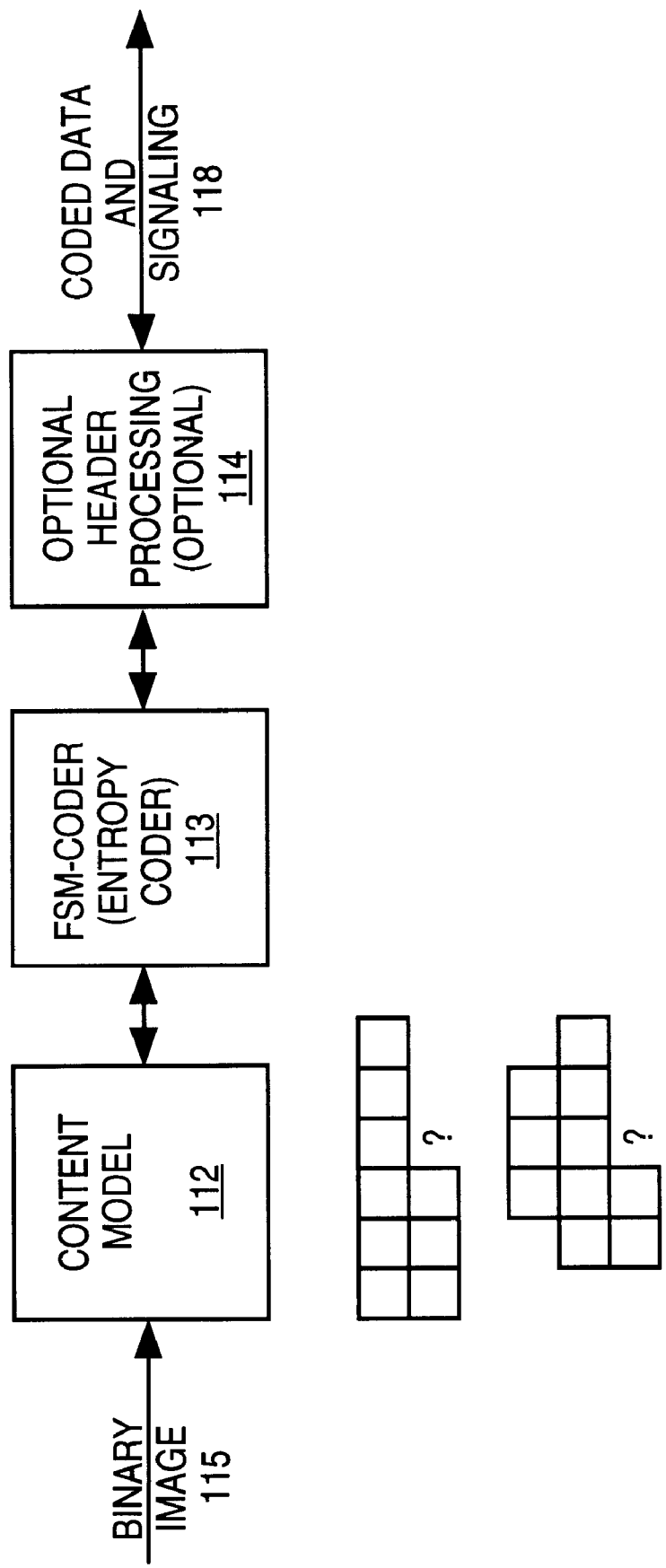
FIG. 1B illustrates an alternate embodiment of an FSM coder-based system.

In an alternate embodiment, such as shown in FIG. 1B, an FSM coder-based system for handling binary images is shown. The binary image may include pixels divided into one of 1024 contexts based on the binary values of neighboring pixels that have already been coded. This is similar to the JBIG Standard. FIG. 1B also includes two examples of contexts based on neighboring pixels.

Although the system is described in conjunction with a reversible wavelet-based system and a binary image compression system, the present invention is applicable to other systems, such as non-wavelet-based systems. Furthermore, although FIG. 1A and 1B are described in conjunction with image data, other types of data and information may be used, such as, for example, sound, audio, text, computer executables and computer data files.

Look-up Table (LUT) Based FSM-coder

The present invention provides a software FSM-coder in which most of the FSM-coder is implemented as one or more look-up tables (LUTs). The FSM-coder encoder of the present invention may use LUTs with address inputs for the bit to be coded (MPS or not), the entropy coder state and/or either the PCLASS or PSTATE. In one embodiment, the PCLASS is a class that contains an actual probability estimate for a binary decision and is used for a range of probabilities. In one embodiment, the PSTATE is the probability estimation state for a binary decision. The PCLASS and PSTATE may correspond to probabilities for other than binary decisions. In one embodiment, the address input for the bit to be coded comprises 1 bit, the entropy encoder state comprises 6 bits, the PCLASS comprises 4 bits and the PSTATE comprises 9 bits. Using this addressing scheme, the total address size is 11 or 16 bits, requiring 2K or 64K LUT entries. Some software implementations of the decoder portion of the FSM-coder use the coded data as an input to the LUT (replacing the bit to be coded). The coded data may be 8 bits in length. This increases the size of the LUT input address to 18 or 23 bits, requiring 256K or 8M LUT entries.

In one embodiment of the present invention, a single table about the size of the encoder table described above is used for both encoding and decoding. In other words, separate tables for both decoding and encoding are not required. By eliminating the huge decoder LUT, a considerable saving is obtained.

Figure 2:
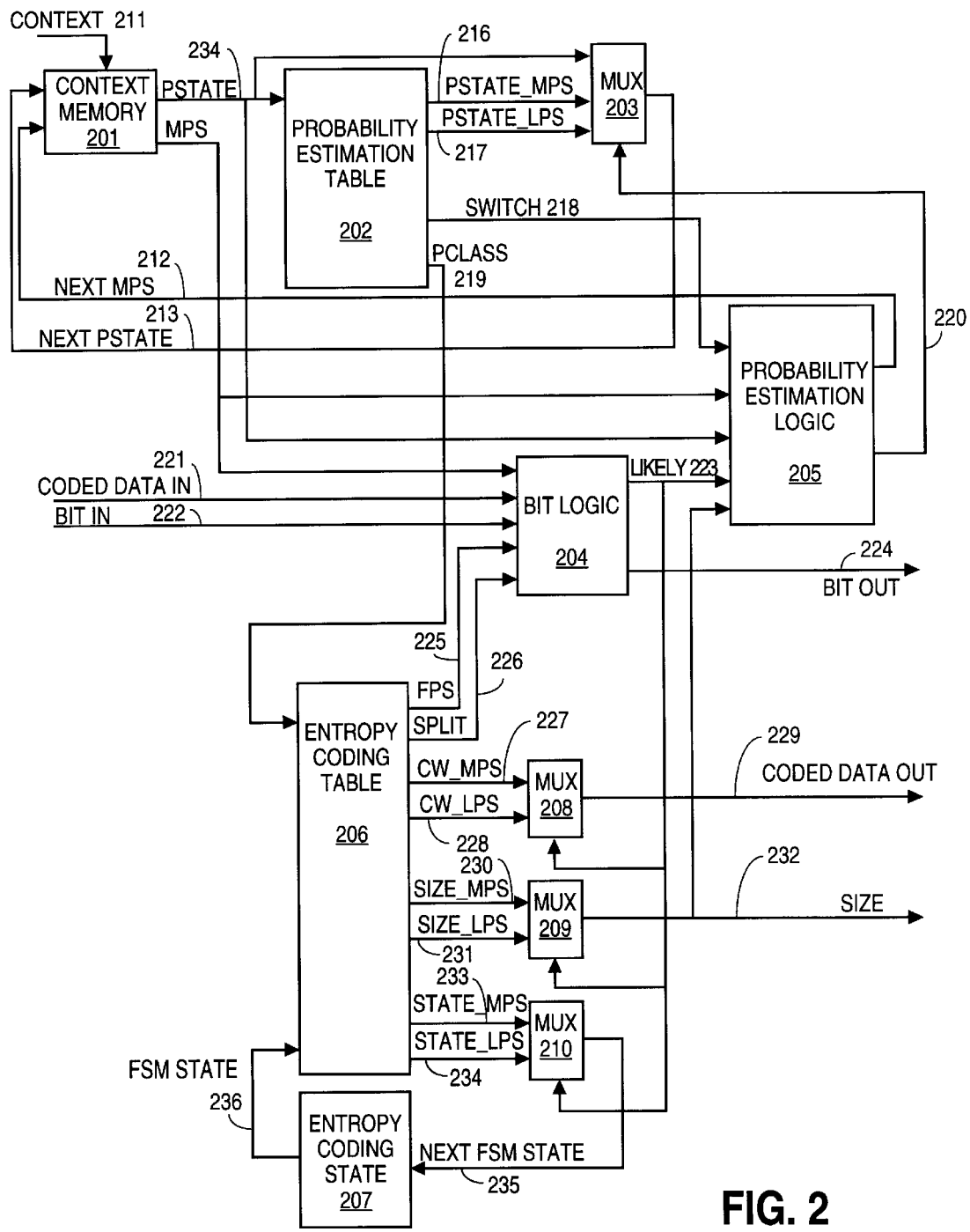
FIG. 2 is a block diagram of one embodiment of a FSM-encoder/decoder having a combined FSM encode/decode table using separate probability estimation and bit generate look-up tables (LUTs).

FIG. 2 is a block diagram of a FSM-encoder/decoder having a combined FSM encode/decode table using separate probability estimation and bit generate LUTs. Referring to FIG. 2, a context memory 201 is coupled to a probability estimation table 202, multiplexer (MUX) 203, probability estimate logic 205, and bit logic 204. Probability estimation table 202 is also coupled to MUX 203 and probability estimation logic 205, as well as to entropy coding table 206. Probability estimation logic 205 is further coupled to MUX 203, bit logic 204, and MUX 209. Entropy coding table 206 is coupled to entropy coding state 207, bit logic 204 and MUXs 208–210. MUXs 208–210 are also coupled to bit logic 204. MUX 210 is also coupled to entropy coding state 207.

The operation during encoding is as follows. Details such as what the values of the LUTs are and how the probability estimation logic operates are described in more detail below. Bit width indications are only examples; in software, these would typically be rounded up to multiples of 8-bits or the word size of the computer running the software.

First, context 211 is used to address context memory 201. In response to context 211, context memory 201 outputs a PSTATE, pstate 234, and an MPS, mps 215. The number of address bits (and memory locations) is application dependent. In one embodiment, 540 memory locations are used, and context memory 201 outputs 9 bits for pstate 234 and 1 bit for mps 215. The 10-bit binary templates in FIG. 1B require 1024 memory locations.

In response to the input of pstate 234, probability estimation table 202, which is a LUT in one embodiment, generates a number of outputs.

Probability estimation table 202 outputs a probability estimate, pclass 219.

Probability estimation table 202 also outputs the next probability estimation state, PSTATE, if a MPS occurred and an update of the PSTATE is required. Probability estimation table 202 also outputs the next PSTATE and whether the MPS should be switched (from 0 to 1 or 1 to 0), as indicated by switch indication 218, if a LPS occurred and an update to the PSTATE is required. In one embodiment, the switch indication 218 comprises 1 bit signal. The next probability estimation states output when an MPS occurred and when an LPS occurred are referred to herein as pstate_mps 216 and pstate_lps 217 respectively.

The pstate_mps 216 and pstate_lps 217, along with pstate 234, are inputs to MUX 203. The probability estimation logic 205 outputs selection indication (e.g., signal(s)) 220 which selects among the probability estimation states that are input to MUX 203 as the next probability estimation state, referred to as next_pstate 213. In one embodiment, if the pstate 234 is less than or equal to 214, selection indication 220 selects either pstate_mps 216 or pstate_lps 217 depending on whether the input bit is an MPS or LPS respectively; if the pstate 234 is greater than 214 and bits are output, then selection indication 220 selects pstate_mps 216 or pstate_lps 217 based on whether the input bit is an MPS or an LPS respectively. On the other hand, if the pstate 234 is greater than 214 and no bits are output (encoding) or consumed (decoding), then selection indication 220 selects pstate 234 as next_pstate 213.

Entropy coding table 206 is coupled to receive pclass 219 and FSM_state 236 from entropy coding state storage 207. In one embodiment, entropy coding state 207 comprises a register, other temporary buffer, queue, or storage mechanism. Entropy coding table 206 operates as a bit generation LUT. Initially, the entropy coding state is 0. Entropy coding table 206 outputs cw(codeword)_mps 227 and cw_lps 228 as codewords (e.g., bit patterns, tokens, symbols, etc.) as the coded data stream. Cw_mps 227 and cw_lps 228 are the codewords that are output in response to an MPS and LPS being input into the encoder, respectively. In one embodiment, cw_mps 227 and cw_lps 228 comprise 8-bit codewords.

Also, in response to its inputs, entropy coding table 206 also outputs an indication of the number of bits in the output. Specifically, entropy coding table 206 outputs size_mps 230 and size_lps 231 indicating the size of the codewords, i.e., the number of bits in cw_mps 227 and cw_lps 228 respectively that contain the actual bit pattern. In one embodiment, each of size_mps 230 and size_lps 231 comprises 4 bits. The outputs of entropy coding table 206 also include state_mps 233 and state_lps 234, which indicate the next entropy coder states if MPS or LPS is output, respectively. In one embodiment, both state_mps 233 and state_lps 234 comprise 6 bits.

Bit logic 204 compares the bit to be coded, bit_in 222, with mps 215 and generates likely indication (e.g., signal(s))

223 if they are the same. On the other hand, if they are not the same, likely indication 223 is not asserted.

If likely indication 223 is true (i.e., asserted), cw_mps 227, size_mps 230 and state_mps 233 are output from MUXs 208–210, respectively, as the output bitstream (coded data out 229), the size of the output (size 232) and the next FSM state 235 (which is loaded into entropy coding state register 207). If likely indication 223 is not true, cw_lps 228, size_lps 231 and state_lps 234 are output from MUXs 208–210, respectively.

Probability estimation logic 205 determines next_mps 212 and controls whether the next PSTATE, next_pstate 213, is the current pstate 234 or one of the updated values, pstate_mps 216 or pstate_lps 217. In one embodiment, probability estimation logic 205 determines next_mps 212 and should be switched if an LPS occurs and if the PSTATE is less than or equal to 4 or is equal to 262. The control to select next_pstate 213 includes logic to generate selection indication 220 to a select input of MUX 203.

Next_mps 212 and next_pstate 213 are written to the location of context memory 201 addressed with an address based on context 211. In one embodiment, the address is context 211, with the data to be written being next_mps 212 and next_pstate 213.

Thus, in this manner the LUT-based encoder/decoder with the separate probability estimation and FSM bit generation performs encoding.

LUT-based encoder/decoder 200 decodes in similar manner. To begin decoding, context memory 201 is addressed by context 211. In response to context 211, context memory 201 retrieves pstate 234 and MPS 215. Again, the number of address bits (and memory locations) is application dependent. In one embodiment, context memory 201 outputs 9 bits for pstate 234 and 1 bit for MPS 215.

In response to pstate 234, probability estimation table 202 outputs probability estimate, pclass 219. In one embodiment, pclass 219 comprises 4 bits. Probability estimation table 202 also outputs the next PSTATE if an MPS occurs and a PSTATE update is required. In such a case, the next PSTATE comprises pstate_mps 216. In one embodiment, a PSTATE update is required when the pstate 234 is less than or equal to 214 or when the pstate 234 is greater than 214 and bits are consumed. In one embodiment, pstate_mps 216 comprises 9 bits. Probability estimation table 202 also outputs the next PSTATE and an indication the MPS should be switched (from 0 to 1 or 1 to 0) if a LPS occurred and the PSTATE update is required. In this case, the next PSTATE is indicated by pstate_lps 217 and the indication of whether the MPS should be switched is indicated by switch indication (e.g., signal(s)) 218. In one embodiment, pstate_lps 217 and switch indication 218 comprise 9 bits and 1 bit, respectively.

Entropy coding table 206 is coupled to receive pclass 219 and the FSM state 236 (from entropy coding state register 207). In response to these inputs, entropy coding table (bit generation LUT) 206 outputs the actual number of bits in cw_mps 227 and cw_lps 228 that contain the actual bit pattern (e.g., codeword, token, symbol, etc.) along with size_mps 230 and size_lps 231 which are the size of the codewords cw_mps 227 and cw_lps 228, respectively. Cw_mps 227 and cw_lps 228 are not used when decoding and do not have to be generated in a decode only embodiment. In one embodiment, these size indications are 4 bits a piece, while the codewords are 8-bits in length. Entropy coding table 206 also outputs state_mps 233 and state_lps 234 as the next entropy states. In one embodiment, these next entropy coder states comprise 6 bits. It should be noted that initially the entropy coding state is 0.

During this decoding process, entropy coding table 206 also outputs a split value 226 that indicates a separation between the MPS and LPS bit patterns in the code stream. In one embodiment, split value 226 comprises 8 bits of data. Entropy coding table 206 also outputs an fps indication, or value, 225 which indicates whether bit patterns on the "00000000" side of split value 226 indicate an MPS or not. In one embodiment, fps value 225 comprises a 1 bit value. The use of split value 226 and fps value 225 will be described in further detail below.

Bit logic 204 is coupled to receive fps value 225 and split value 226 as well as mps 215 and coded data_in 221. In response to these inputs, bit logic 204 compares 8 bits of the bitstream (coded data_in 221) with split value 226 and generates likely indication (e.g., signal(s)) 223 using the truth table shown in Table 1 below.

TABLE 1

| Generation of Likely Indication When Decoding. | | |
|---|---|---|
| coded data in >= split | fps | likely |
| 0 | 0 | 0 |
| 0 | 1 | 1 |
| 1 | 0 | 1 |
| 1 | 1 | 0 |

If likely indication 223 is true, state_mps 223 is output of MUX 210 as next FSM state 235, which is loaded into entropy coding state register 207. Also, if likely indication 223 is true, size_mps 230 is output from MUX 209 to specify the number of bits of coded data that have been used in decoding and are now no longer needed. This allows the control of a shift register (not shown to avoid obscuring the present invention) that shifts in coded_data_in 221. Otherwise, if likely indication 223 is not true, size_lps 231 and state_lps 234 are output from MUXs 209 unused and 210, respectively. It should be noted that the coded_data_out 229 is unused (i.e., "a don't care") during decoding.

Also during decoding, probability estimation logic 205 determines the next MPS value and outputs it as next_mps 212. In one embodiment, next_mps 212 comprises a one bit value. In one embodiment, the MPS value is switched if an LPS occurs and if the PSTATE is less than or equal to 4 or is equal to 262. Probability estimation logic 205 also controls whether the next PSTATE is the current PSTATE, as indicated by pstate 234 or one of the updated PSTATE values indicated by pstate_mps 216 or pstate_lps 217. Probability estimation logic 205 controls this selection by using selection indication (e.g., signal(s)) 220 to MUX 203, the output of which is next_pstate 213.

Both next_mps 212 and next_pstate 213 are written to the location of context memory 201 addressed by context 211.

Note that context memory 201 has the same inputs whether encoding or decoding. Also note that the enabling logic to enable the decoding operation or the encoding operation is not shown but would be apparent to one skilled in the art.

Note that the encoder/decoder of FIG. 2, like other coders described herein, shows two separate data inputs, one for coded data and another for uncoded data. In one embodiment, the coder may receive both these types of data on the same input or port and use well-known logic and/or one or more encode/decode control signals to notify the pertinent parts of the coder or selection logic which type of data is currently being received by the coder. Such an input structure may be incorporated into any embodiment described herein.

Figure 3:
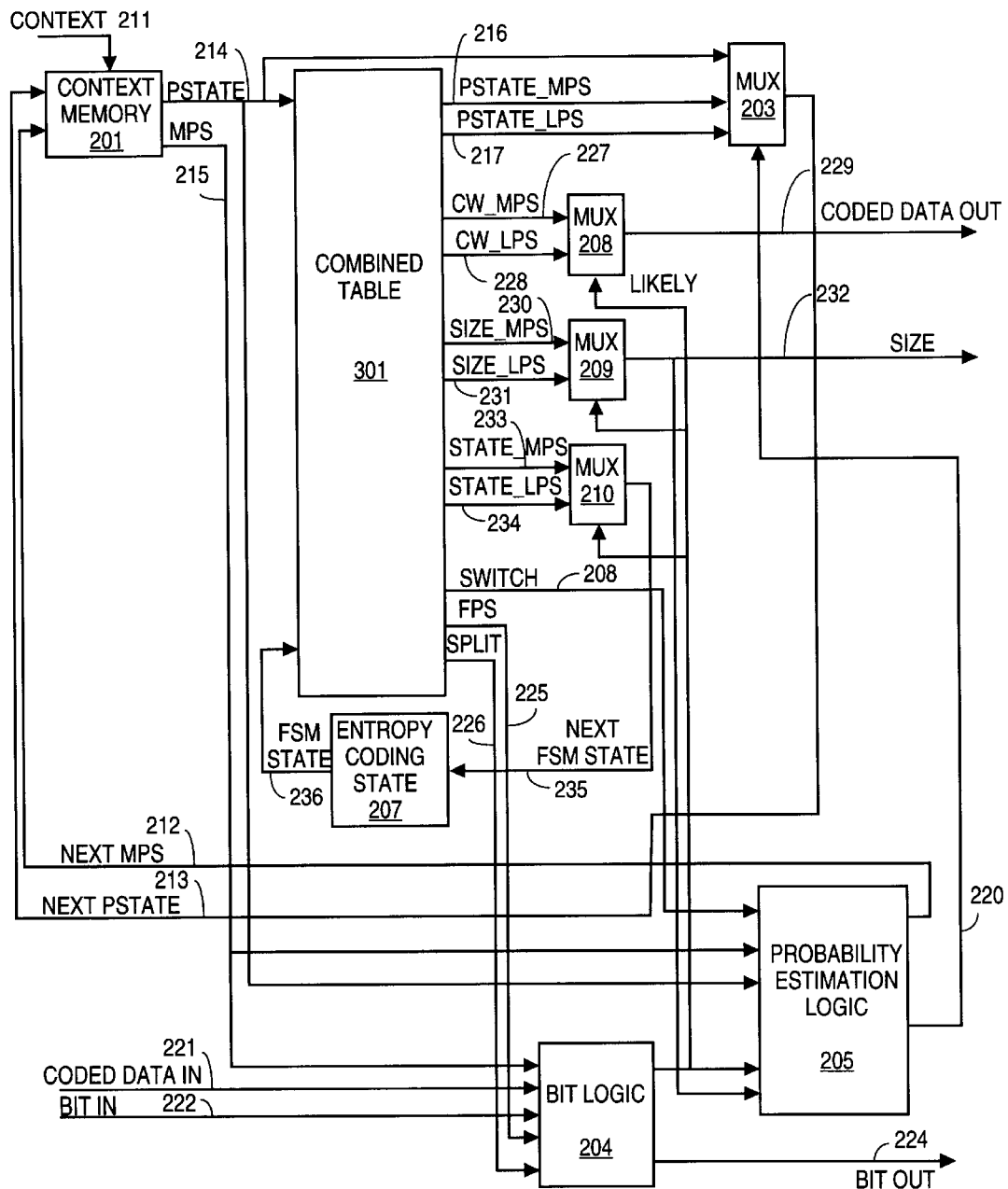
FIG. 3 is a block diagram of one embodiment of an FSM encoder/decoder with a single LUT that performs both probability estimation and bit generation.

FIG. 3 illustrates an FSM encoder/decoder with a single LUT that performs both probability estimation and bit generation. By using a single LUT, an implementation in software uses fewer operations (instructions) at the expense of a larger LUT.

During encoding, the operation is as follows. First, context 211 is used to address context memory 201. In response to context 211, context memory 201 outputs pstate 234 and mps 215. The number of address bits (and memory locations) is application dependent. In one embodiment, 540 memory locations are used, and context memory 201 outputs 9 bits for pstate 234 and 1 bit for mps 215.

In response to the input of pstate 234, combined probability estimation and FSM bit generation table 301 outputs the next probability estimation state, PSTATE, if a MPS occurred and update of the PSTATE is required. In one embodiment, a PSTATE update is required when the pstate 234 is less than or equal to 214 or when pstate 234 is greater than 214 and either bits are output (in the case of encoding or consumed in the case of decoding). In one embodiment, pstate_mps 216 comprises 9 bits.

Combined table 202 also outputs the next PSTATE and whether the MPS should be switched (from 0 to 1 or 1 to 0), as indicated by switch indication 218, if an LPS occurred and an update to the PSTATE is required. In one embodiment, the switch indication 218 comprises 1 bit signal. The next probability estimation state when an MPS occurred or an LPS occurred comprise pstate_mps 216 and pstate_lps 217 respectively.

The pstate_mps 216 and pstate_lps 217, along with pstate 234, are inputs to MUX 203. Probability estimation logic 205 outputs a selection indication (e.g., signal(s)) 220 which selects among the probability estimation states on the inputs of MUX 203 as the next probability estimation state, next_pstate 213.

Combined table 301 is coupled to receive FSM state 236 from entropy coding state storage 207. In one embodiment, entropy coding state 207 comprises a register, temporary buffer, queue, or other storage mechanism. Combined table 301 operates as a bit generation LUT. Initially, the entropy coding state is 0, and entropy coding table 206 outputs cw_mps 227 and cw_lps 228 as codewords (bit patterns) as the coded data stream. In one embodiment, cw_mps 227 and cw_lps 228 comprise 8-bit codewords. Combined table 301 also outputs an indication of the number of bits in the output. Specifically, combined table 301 outputs size_mps 230 and size_lps 231 indicating the size of the codewords, i.e., the number of bits in cw_mps 227 and cw_lps 228 respectively that contain the actual bit pattern. In one embodiment, each of size_mps 230 and size_lps 231 comprises 4 bits. The outputs of combined table 301 also includes state_mps 233 and state_lps 234 which indicate the next entropy coder states if an MPS or an LPS is output respectively. In one embodiment, each of state_mps 233 and state_lps 234 comprises 6 bits.

Bit logic 204 compares the bit to be coded, bit_in 222, with mps 215 and asserts likely indication 223 (likely indication 223 is true) if they are the same. On the other hand, if they are not the same, likely indication 223 is not asserted (likely indication 223 is not true).

If likely indication 223 is true (i.e., asserted), cw_mps 227, size_mps 230 and state_mps 233 from MUXs 208–210, respectively, are output to the bitstream and next_FSM_state 235 (which is loaded into entropy coding state register 207). Otherwise, cw_lps 228, size_lps and state_lps 234 are output from MUXs 208–210 respectively.

Probability estimation logic 205 determines next_mps 212 and controls whether the next PSTATE, next_pstate 213, is the current pstate as indicated by pstate 234 or one of the updated values, pstate_mps 216 or pstate_lps 217. This control occurs, in part, by generating selection indication 220 to MUX 203, as described above.

Next_mps 212 and next_pstate 213 are written to the location of context memory 201 addressed by context 211. That is, the address comprises context 211 and the data to be written comprises next_mps 212 and next_pstate 213.

The decoding operation for FIG. 3 is similar. First, context 211 is used to address context memory 201. In response to context 211, context memory 201 outputs pstate 234 and mps 215. The number of address bits (and memory locations) is application dependent. In one embodiment, 540 memory locations are used. Context memory 201 outputs 9 bits for pstate 234 and 1 bit for mps 215.

In response to the input of pstate 234, combined table 301 outputs the next probability estimation state, PSTATE, if an MPS occurred and an update of the PSTATE is required. Combined table 301 also outputs the next PSTATE and whether the MPS should be switched (from 0 to 1 or 1 to 0), as indicated by switch indication 218, if a LPS occurred and an update to the PSTATE is required. In one embodiment, the switch indication 218 comprises 1 bit signal. The next probability estimation states when an MPS occurred and an LPS occurs comprise pstate_mps 216 and pstate_lps 217 respectively. Pstate_mps 216 and pstate_lps 217, along with pstate 234, are input to MUX 203. Probability estimation logic 205 outputs a selection indication 220 which selects among the probability estimation states on the inputs of MUX 203 as the next probability estimation state, next_pstate 213.

FSM state 236 (from entropy coding state register 207) is also an input to combined table (LUT) 301. In one embodiment, entropy coding state 207 comprises a register, temporary buffer, queue, or other storage mechanism. Combined table 301 operates as a bit generation LUT. Initially, the entropy coding state is 0. Combined table 301 outputs cw_mps 227 and cw_lps 228 as codewords (bit patterns, tokens, symbols, etc.) as the coded data stream depending on whether likely indication 223 is asserted. In one embodiment, cw_mps 227 and cw_lps 228 comprise 8-bit codewords. A decoder only embodiment does not need cw_mps 227 and cw_lps 228. Entropy coding table 206 also outputs an indication of the number of bits in the output. Specifically, entropy coding table 206 outputs size_mps 230 and size_lps 231 indicating the size of the codewords, i.e. the number of bits in cw_mps 227 and cw_lps 228, respectively, that contain the actual bit patterns. In one embodiment, each of size_mps 230 and size_lps 231 comprises 4 bits. The outputs of combined table 301 also includes state_mps 233 and state_lps 234 which indicate the next entropy coder states if an MPS or an LPS is output respectively. In one embodiment, state_mps 233 and state_lps 234 comprise 6 bits.

Bit logic 204 of FIG. 3 operates in the same manner as described above in conjunction with FIG. 2, including performing decoding using split value 226 and fps indication 225.

If likely indication 223 is true, state_mps 223 is output of MUX 210 as next FSM state 235, which is loaded into entropy coding state register 207. Also, if likely indication 223 is true, size_mps 230 is output from MUX 209 to specify the number of bits of coded data that have been used in decoding and are now no longer needed. This allows the control of a shift register (not shown to avoid obscuring the present invention) that shifts in coded_data_in 221. Otherwise, if likely indication 223 is not true, size_lps 231 and state_lps 234 are output from MUXs 209 unused and 210, respectively. It should be noted that the coded_data_out 229 is unused (i.e., "a don't care") during decoding.

Probability estimation logic 205 determines next_mps 212 and controls whether the next PSTATE, next_pstate 213, is the current pstate, pstate 234, or one of the updated values, pstate_mps 216 or pstate_lps 217. This control occurs, in part, by generating selection indication 220 to MUX 203, as described above.

Next_mps 212 and next_pstate 213 are written to the location of context memory 201 addressed by context 211. That is, the address comprises context 211 and the data to be written comprises next_mps 212 and next_pstate 213. LUTs labeled "separate" require a "probability estimation only" LUT. LUTs labeled "combined" do not require a "probability estimation only" LUT.

Table 2 summarizes the sizes of various LUTs. This table shows the significant savings in using a single encode/decode table with split points for decoding over the use of decode-only tables which use the codestream as input. Referring to Table 2, LUTs labeled "separate" require a "probability estimation only" LUT, while LUTs labeled "combined" do not require a "probability estimation only" LUT.

TABLE 2

LUT sizes.

| LUT | minimum size | size rounded up to bytes | size rounded up to 32 bits |
|---|---|---|---|
| probability estimation only | 269 × (9 + 9 + 4 + 1) = 6.0 Kbits | 269 × 6 = 1.6 Kbytes | 269 × 4 × 4 = 4.2 Kbytes |
| encode only, separate | (2 × 16 × 61) × (8 + 4 + 6) = 34.3 Kbits | (2 × 16 × 61) × (1 + 1 + 1) = 5.7 Kbytes | (2 × 16 × 61) × 3 × 4 = 22.9 Kbytes |
| decode only, separate | (256 × 16 × 61) × (1 + 6) = 1708 Kbits | (256 × 16 × 61) × (1 + 1) = 488 Kbytes | (256 × 16 × 61) × 2 × 4 = 1952 Kbytes |
| encode only, combined | (2 × 269 × 61) × (8 + 4 + 6 + 9 + 1) = 897 Kbits | (2 × 269 × 61) × 6 = 192 Kbytes | (2 × 269 × 61) × 5 × 4 = 641 Kbytes |
| decode only, combined | (256 × 269 × 61) × (1 + 6 + 9 + 1) = 69,738 Kbits | (256 × 269 × 61) × 5 = 20,511 Kbytes | (256 × 269 × 61) × 4 × 4 = 65,636 Kbytes |
| encode/decode, separate | (16 × 61) × (8 + 8 + 4 + 4 + 6 + 6 + 8 + 1) = 42.9 Kbits | (16 × 61) × 8 = 7.6 Kbytes | (16 × 61) × 8 × 4 = 30.5 Kbytes |
| encode/decode, combined | (269 × 61) × (8 + 8 + 4 + 4 + 6 + 6 + 8 + 1 + 9 + 9 + 1) = 1025 Kbits | (269 × 61) × 13 = 208 Kbytes | (269 × 61) × 11 × 4 = 705 Kbytes |

Logic-based FSM coder

In one embodiment, the FSM coder is implemented in hardware. The following description sets forth at least one such embodiment. Some of the description is given in an exemplary behavioral Verilog hardware description language.

Figure 4:
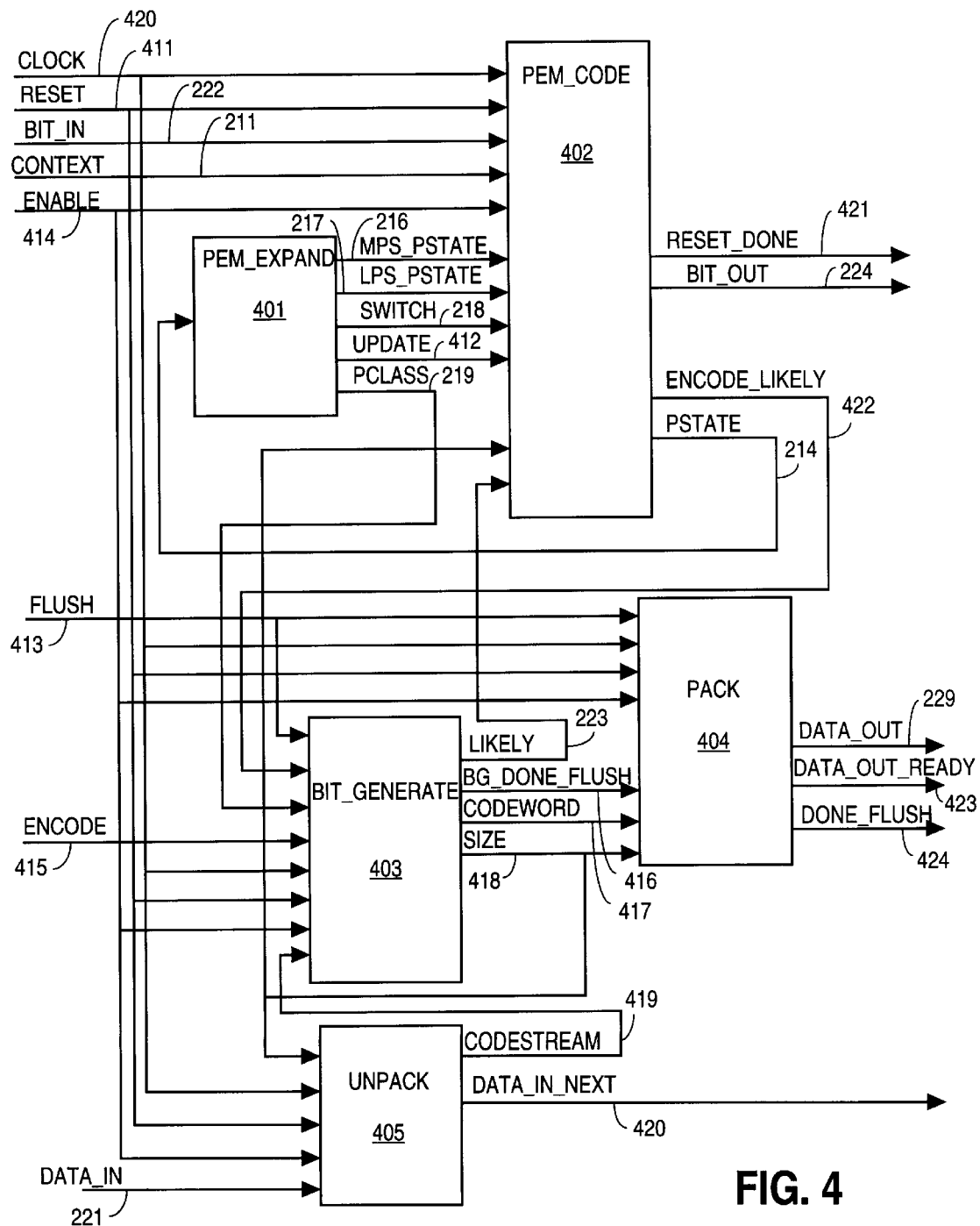
FIG. 4 is a block diagram of one embodiment of the FSM-coder of the present invention.

The FSM coder of the present invention reduces hardware cost. In one embodiment, the size of the entropy coder (bit generation) look-up table is reduced significantly, and in some embodiments, its size is reduced to substantially a minimum in which redundant entries are not used. Logic generates all the required information from the non-redundant LUT entries. Codeword bit patterns and lengths do not need to be generated by the LUT; they are generated with logic. FIG. 4 is a block diagram of one embodiment of the FSM-coder of the present invention. Pem_expand unit 401 is coupled to pem_code unit 402 and bit_generate unit 403. Pem_code unit 402 is also coupled to bit_generate unit 403. Pack unit 404 and unpack unit 405 are also coupled to bit_generate unit 403.

Pem_code unit 402 contains the context memory and performs multiple context probability estimation. Pem_expand unit 401 converts a PSTATE, such as pstate 234, into the information that describes that PSTATE. Bit_generate unit 403 performs the conversion between uncoded bits and coded bits in response to a pclass, such as pclass 219. Pack unit 404 combines variable length codewords into bytes when encoding, while unpack unit 405 performs variable length shifting of the bytes of the coded data stream during decoding.

The inputs to FSM-coder 400 are as follows.

bit_in 222 Input to pem_code unit 402 indicating the bit to be coded during encoding.

data_in 221 Input to unpack unit 405 indicating the coded data (bitstream during decoding). In one embodiment, data is input one byte at a time, although other sizes of data entry may be used.

context 211 The context bin (context memory address) input to pem_code unit 402.

clock 410 System clock input to pem_code unit 402, pack unit 404, bit_generate unit 403 and unpack unit 405. In one embodiment, the clock input 410 may serve as an enable signal for the FSM coder.

enable 414 Control indication (e.g., signal(s)) coupled for receipt by pem_code unit 402, bit_generate unit 403, pack unit 404, and unpack unit 405, to enable coding or decoding of a bit in the current clock cycle.

encode 415 Control indication (e.g., signal(s)) to select encoding or decoding.

flush 413 Control indication (e.g., signal(s)) to enable flushing at the end of encoding. Flush signal 413 causes bit_generate unit 403 to be flushed Flushing refers to the operation that occurs at the end of encoding where any information not yet output to the codestream is output. When bit_generate unit 403 has completed flushing, bg_done_flush signal 416 is asserted to pack unit 404. In response to bg_done_flush signal 416 and flush signal 413, pack unit 404 flushes itself. When flushing is completed, pack unit 404 asserts done_flush signal 424.

reset 411 Asynchronous initialization indication (e.g., signal(s)) for all storage elements (e.g., flip-flops) in pem_code unit 402, pack unit 404, bit_generate unit 403, and unpack unit 405. In response to reset 411 being de-asserted, internal memories will be cleared, including the context memories in pem_code unit 402.

The outputs of the FSM coder are as follows.

data_out 229 Coded data (bitstream) during encoding. In one embodiment, data is output one byte at a time, although other sizes of data output may be used.

data_out_ready 423 Control indication (e.g., signal(s)) to indicate that data_out 229 is valid in the current clock cycle.

bit_out 224 Decoded bit.

reset_done 421 Control indication (e.g., signal(s)) to indicate that reset has been completed. In one embodiment, reset_done 421 indicates that all internal memories have been cleared following de-assertion of reset.

done_flush 424 Control indication (e.g., signal(s)) to indicate that flushing is complete after flush signal 413 is asserted.

Pem_expand unit 401 generates a pclass 219 in response to pstate 234 which is output from pem_code 402 in response to context 211 (for which it corresponds). Pem_expand unit 401 also generates an indication of the next PSTATE if an MPS is generated, referred to mps_pstate 216, and an indication of the next_pstate if an LPS is generated, as indicated by lps_pstate 217 (when the MPS is to be switched). Both mps_pstate 216 and lps_pstate 217 represent PSTATEs that are used when a PSTATE update is required. Pem_expand unit 401 also generates switch indication 218 to indicate that the MPS should be switched (from 0 to 1 or 1 to 0).

Pem_expand unit 401 also indicates whether an update to the PSTATE is necessary using update indication 412. In one embodiment, if update indication (e.g., signal(s)) 412 is asserted, the PSTATE is updated no matter what the MPS value is. On the other hand, if update indication 412 is not asserted (i.e., not true), an update only occurs if emitting or using a codeword, if the size of the codeword is greater than 0, or if the size of the output is less than 0. The size of the output is indicated by the size of the output codeword, which, in turn, is indicated by size indication 418 from bit-generation logic 403.

In response to the pclass 219, bit-generate unit 403 performs bit generation and indicates whether the bit to be coded, bit-in 222, is the same as the MPS (e.g., MPS 520). This comparison occurs in pem_code unit 402, which is described in greater detail in FIG. 5 (e.g., comparator 512). If so, likely indication 223 is asserted. In this case, likely indication 223 indicates that encoding is likely and is input to pem_code unit 402.

In response to likely indication 223, pem_code unit 402 sets bit_out 224 to the MPS if likely indication 223 is true, otherwise to its compliment in the case where likely indication 223 is not true.

Based on its input signals, pem_code unit 402 generates the next pstate, pstate 234, and outputs a decoded bit as bit_out 224 when decoding. During encoding, however, bit_out 224 is ignored and encode_likely indication 422 is asserted and received by bit_generate unit 403. During decoding, encode indication 415 is not asserted and unpack unit 405 unpacks the bytes of data into a variable length codewords that are output as codestream 419 to bit_generate unit 403. Unpack unit 405 also outputs data_in_next signal 420 which indicates that the current input of data_in 221 has been consumed and requests the next bit of data.

In response to codestream 419 and pclass 219, bit_generate unit 403 generates codeword 417 and a size indication 418. In response to codewords 417 and size indication 418, pack unit 404 combines the variable length codewords into bytes.

In one embodiment, bit_out signal 224 may be used to update the context model to make encoding and decoding the same. Pack 404 is not used when decoding.

Each of these units will be described in greater detail below.

An exemplary Verilog HDL description of FIG. 4 is as follows.

```
// Copyright 1997 RICOH
// FSM Entropy Coder (with probability estimation and context
// memory)
module coder (clock, reset, bit_in, context, data_in,
    encode, enable, flush, reset_done, bit_out,
    data_out, data_out_ready, data_in_next,
        done_flush);
    parameter                CONTEXTS = 1024;
    input clock;
    input reset;
    input bit_in;
    input [9:0] context;
    input [7:0] data_in;
    input encode;/* 1 = encode, 0 = decode */
    input enable;
    input flush;
    output reset_done;
    output bit_out;
    output [7:0] data_out;
    output data_out_ready;
    output data_in_next;
    output done_flush;
    wire [7:0] codeword;      // encoder
    wire [7:0] codestream;    // decoder
    wire [3:0] size;
    wire [3:0] pclass;
    wire       encode_likely;
    wire       likely;        // encode and decode
    wire [9:0] pstate;
    wire [9:0] mps_pstate;
    wire [9:0] lps_pstate;
    wire       switch;
    wire       update;
    wire       bg_done_flush;
    pem_code #(CONTEXTS) cd (.clock(clock), .reset(reset),
.bit_in(bit_in),
        .likely_in(likely), .context(context),
.mps_pstate(mps_pstate),
        .lps_pstate(lps_pstate), .switch(switch),
.update(update), .size(size),
        .enable(enable),
        .bit_out(bit_out), .likely_out(encode_likely),
            .reset_done(reset_done),
        .pstate(pstate));
    bit_generate bg (.clock(clock), .reset(reset),
.likely_in(encode_likely),
        .pclass(pclass), .encode(encode), .codestream(codestream),
        .enable(enable), flush(flush),
        .size(size), .likely_out(likely), .codeword(codeword),
        .done_flush(bg_done_flush));
    pem_expand pme (.pstate(pstate),
        .pclass(pclass), .mps_pstate(mps_pstate),
.lps_pstate(lps_pstate),
        .switch(switch), .update(update));
    // pack is only needed for encoding
    pack pk (.clock(clock), .reset(reset), .data_in(codeword), .size(size),
        .enable(enable | (flush & ~ bg_done_flush)),
        .flush(flush & bg_done_flush),
        .data_out(data_out), .data_out_ready
        (data_out_ready),
        .done_flush(done_flush));
    // unpack is only needed for decoding
    unpack upk (.clock(clock), .reset(reset), .data_in(data_in),
.size(size),
        .enable(enable),
        .data_out(codestream), .next_byte(data_in_next));
endmodule
```

Multiple Context Probability Estimation

Figure 5:
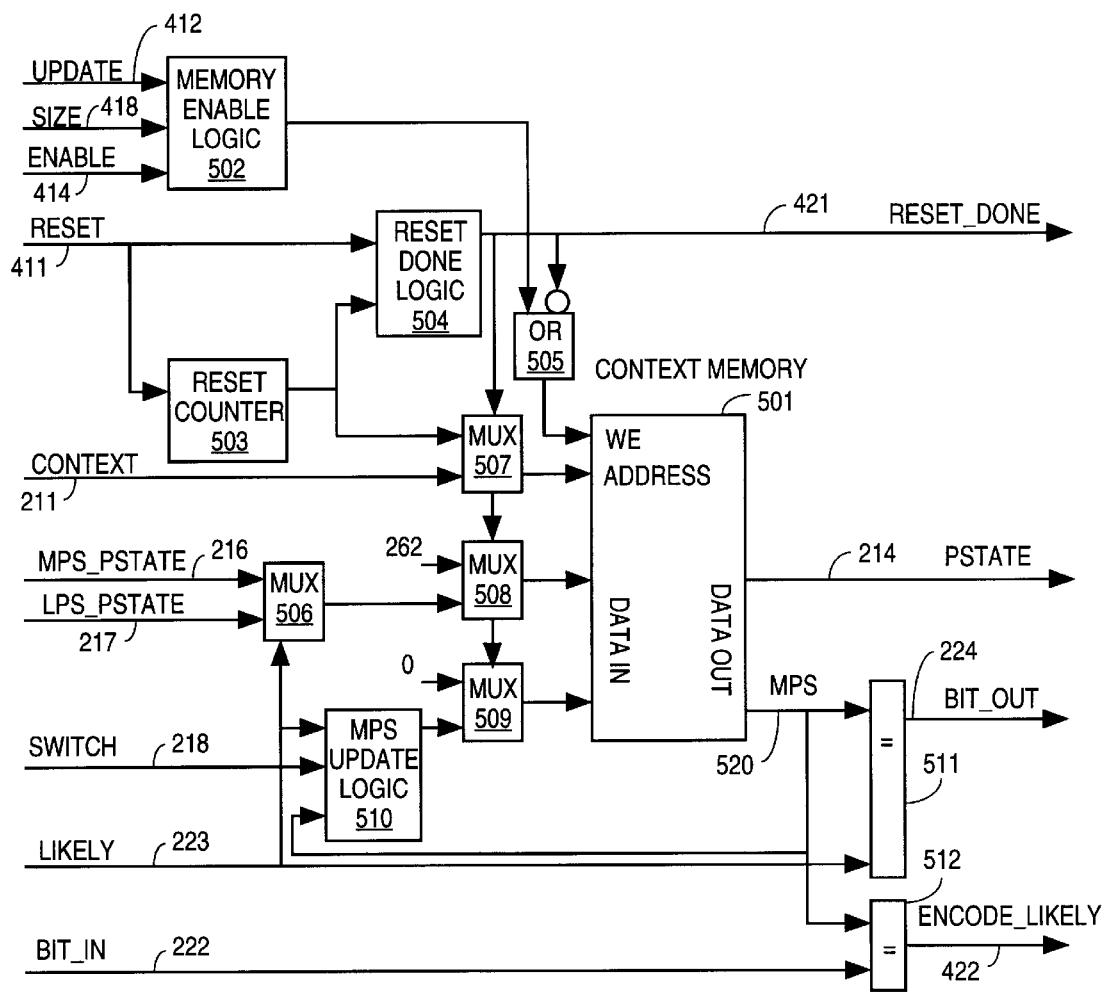
FIG. 5 is a block diagram of one embodiment of the pem_code unit.

A block diagram of one embodiment of pem_code unit 402, which contains the context memory and performs multiple context probability estimation, is shown in FIG. 5.

Referring to FIG. 5, memory enable logic 502 is coupled to receive update indication 412, size indication 418 and enable indication 414. In response to these inputs, memory enable logic 502 generates an output that is coupled to one input of OR gate 505. Reset indication 411 is coupled to inputs of reset counter 503 and reset done logic 504. The output of reset counter 503 is also coupled to another input of reset done logic 504, as well as one input of MUX 507. The output of reset done logic 504 is a select signal coupled to MUXs 507–509 and coupled to a negating input of OR gate logic 505. The output of reset done logic 504 is also output as reset_done indication 421. The output of OR gate 505 is coupled to the write enable input of context memory 501.

MUXs 507–509 are two input multiplexers. The other input of MUX 507 is coupled to context 211. MUX 508 is coupled to receive an initial pstate and the output of MUX 506. In one embodiment, the initial pstate is 262. Other initial pstates may be used. Selection of the initial pstates allows for faster adaptation. For more information on faster adaptation, see U.S. patent application Ser. No. 08/768,237, entitled "Method and Apparatus for Encoding and Decoding Data", filed Dec. 17, 1996, assigned to the corporate assignee of the present invention, and incorporated herein by reference.

The inputs of MUX 506 are coupled to receive mps_pstate 216 and lps_pstate 217, one of which is selected in response to likely indication 223 coupled to the select input of MUX 506. The inputs of MUX 509 are coupled to an initializing value (e.g., 0 in one embodiment) and the output of MPS update logic 510. The inputs of MPS update logic 510 are coupled to receive likely indication 223, switch indication 218 and MPS 520 output from context memory 501. The outputs of each of MUXs 507–509 are coupled to inputs of context memory 501.

MPS 520 output from context memory 501 is coupled to one input of comparator 511 and one input of comparator 512. The other input of comparator 511 comprises likely indication 223, while the other input to comparator 512 comprises bit_in 222. Although not shown to avoid obscuring the invention, clock signal 410 is coupled to all registers and counters.

Reset indication 411 clears reset_counter 503 to 0. After reset is de-asserted, reset_counter 503 generates addresses for each context memory location in context memory 501 and an initial PSTATE and an initial MPS are written to each context memory location. The initial values are written using MUXs 507–509 in conjunction with reset_done signal 421 output from reset done logic 504. Reset_done signal 421 acts as a select signal for MUXs 507–509, selecting context memory addresses from reset counter 503 with MUX 507, an initial pstate with MUX 508 and an initial MPS with MUX 509. In one embodiment, the initial PSTATE value of 262 and the initial MPS value of 0 are written into memory locations in context memory 501. After all memory locations have been initialized, reset done logic 504 asserts rest_done indication 421.

During coding, context memory 501 is written to when its write enable (WE) input is asserted. The WE input of context memory 501 is asserted when the output of OR gate logic 509 is high. The output of OR gate logic 509 is high when the output of reset done logic 504 is low, indicating that reset has not completed, or when the output of memory enable logic 502 is high.

When writing to context memory 501, and not in reset, a context model address from context 211 is provided via MUX 507, the next probability estimate state via MUX 508, and the MPS via MUX 509. The input to MUX 508 is the output of MUX 506, which is either mps_state 216 or lps_state 217, one of which is selected based on likely indication 223. The MPS value from MPS update logic 510 is the compliment of the MPS value if switch indication 218 is asserted and if an LPS occurred.

The data written into context memory 501 is the PSTATE selected by likely indication 223 and MPS which is changed when likely indication 223 is 0 and switch indication 218 is 1. In one embodiment, if likely indication 223 is true, MUX 506 outputs mps_pstate 216; otherwise, it outputs lps_pstate 217. The output of MPS update logic 510 comprises MPS 520 XORed with the result of ANDing switch indication 218 with the negation of likely indication 223.

The outputs of context memory 501 are pstate 234 and MPS 520.

For encoding, the bit to be coded (bit_in 222) is compared using comparator 512 with MPS 520 to generate encode_likely indication 422.

In one embodiment, encode_likely indication 422 is generated by XNORing MPS 520 with bit_in 222, where MPS 520 is indicated by one bit of the entry in context memory 501. Note that logic (not shown) is used for feeding back encode_likely signal 422 to likely indication 223. This is described in more detail below. For decoding, likely indication 223 is compared using comparator 511 with MPS 520 to generate the decoded bit (bit_out 224). In one embodiment, bit_out 224 is generated by XNORing MPS 520 with likely indication 223. The XNORing function is equivalent to matching the MPS 520 with likely indication 223.

In FIG. 5, a single memory is used, and the memory outputs the information for a single context. Parallel memories may be used to increase speed. Often, the previously decoded bit effects the context for the next bit. This feedback to the context model, referred to herein as the bit-to-context delay, can limit speed. One way to increase speed is to have multiple memory outputs that correspond to the context bins used for both values of the previous bit. The memory access may be performed in parallel (pipelined) with generating the previous bit. The proper context bin of the two can be multiplexed when the previous bit is known. Multiplexing is typically much faster than memory access. Either a single memory with multiple outputs or multiple memories may be used.

Pipelining memory accesses requires that stale information not be used when the same memory location is used twice in succession (or within some minimum number of consecutive clock cycles). Once a memory location is first read, it should not be read again until the updated value is written back to the memory. Instead of reading the memory for following reads, the value already outside the memory undergoing processing should be used.

An exemplary Verilog description corresponding to FIG. 5 follows below:

```
// Copyright 1997 RICOH
// This is the multi-context part of the entropy coder
// It contains the context memory which stores Pstates,
// and handles using this memory.
module pem_code(clock, reset, bit_in, likely_in, context,
    mps_pstate, lps_pstate, switch, update, size, enable,
    bit_out, likely_out, reset_done, pstate);
parameter CONTEXTS = -1; // override this or else!
input clock;
input reset;
input bit_in;
input likely_in;
input [9:0] context;
input [9:0] mps_pstate;
input [9:0] lps_pstate;
input switch;
input update;
```

-continued

```
            input [3:0] size;
            input enable;
            output bit_out;
            output likely_out;
            output reset_done;
            output [9:0] pstate;
            reg [9:0] ctx_mem[0:CONTEXTS-1];
            reg [10:0] reset_counter;
            wire [9:0] pstate80_mps9;
            wire [9:0] next_pstate80_mps9;
            assign pstate80_mps9 = ctx_mem[context];
            assign pstate = pstate80_mps9 [8:0];
            // when encoding
            assign likely_out = (bit_in ~^ pstate80_mps9[9]);
            // encoding and decoding
            assign bit_out = (likely_in ~^ pstate 80_mps9[9]);
            assign next_pstate80_mps9[8:0] = likely_in ? mps_pstate :
lps_pstate;
            assign next_pstate80_mps9[9] = ((~likely_in) & switch) ^
pstate
                80_mps9[9];
            assign reset_done = (~reset) && (reset_counter >=
CONTEXTS);
        always @ (posedge clock)
            begin
                if (enable && (update || (size > 0)))
                    ctx_[context] = next_pstate80_mps9;
                if (reset_counter < CONTEXTS)
                    begin
                        ctx_mem[reset_counter] = 262;
                        reset_counter = reset_counter + 1;
                    end
            end
    always @ (reset)
        if (reset)
            reset_counter = 0
endmodule
```

Probability State Expansion

Figure 6:
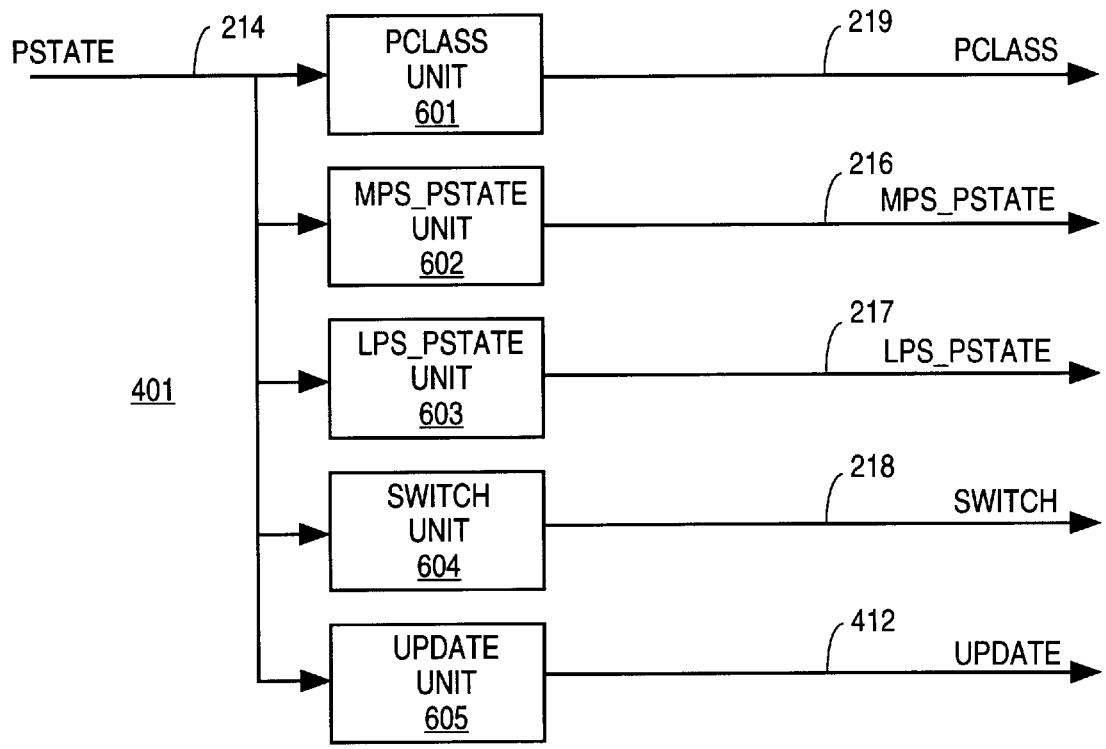
FIG. 6 is a block diagram of one embodiment of the pem_expand unit.

FIG. 6 is a block diagram of one embodiment of the pem_expand unit 401 that converts pstate 234 into the information that describes that PSTATE represented by its output.

Referring to FIG. 6, the probability state expansion unit 401 comprises pclass unit 601, mps_pstate unit 602, lps_pstate unit 603, switch unit 604 and update unit 605, each of which is coupled to receive pstate 234 and generate its corresponding output.

Pclass unit 601 generates pclass 219 in response to pstate 234. In one embodiment, the probability estimate is a 4 bit value. In one embodiment, pstate 234 ranges from 0 to 268 and is converted into a pclass ranging from 0–15. An example of code to perform this function is given below.

MPS_pstate unit 602 generates mps_pstate 216 (in response to pstate 234), which is the next PSTATE if a MPS occurs and the PSTATE is updated. In one embodiment, mps_pstate 216 comprises 9 bits. In one embodiment, mps_state 216 is pstate 234 incremented by an integer from 0 to 5 or decremented by 11 based on the value of pstate 234.

LPS_pstate unit 603 generates lps_pstate 217 (in response to pstate 234), which is the next PSTATE if a LPS occurs and the PSTATE is updated. In one embodiment, lps_pstate 217 comprises 9 bits. In one embodiment, lps_state 216 is pstate 234 incremented by an integer 1, 3 or or decremented by an integer ranging from −1 to −246 based on the value of pstate 234.

Switch unit 604 asserts switch indication 218 if the MPS is to be switched. In one embodiment, switch indication 218 is asserted if pstate 234 is less than or equal to 4 or equal to 262; otherwise, switch indication 218 is deasserted. Switch indication 218 indicates that the MPS stored in a context memory, such as context memory 501, should be changed if a bit occurs that is not likely. In one embodiment, switch indication 218 comprises a signal.

In one embodiment, update unit 605 asserts update indication 412 if the pstate is less than or equal to 214. Note that the states less than or equal to 214 are used for low skew states (close to 50%) where good probability estimation requires updating for every bit. States greater than 214 are used for high skew states where good probability estimation using a small number of states requires not updating for every MPS. In other embodiments, a state other than 214 may be used, with its selection being based on the skew and whether the probability estimation is such to require updating for every bit. This may be a data specific selection. Update indication 412 indicates that an update of context memory should be performed even if no coded data was generated/consumed. In one embodiment, update indication 412 comprises a signal. The probability estimation may be updated every bit. In an alternative embodiment, the probability estimation is updated anytime bits are output (or consumed).

An exemplary Verilog HDL that corresponds to FIG. 6 is given below. One embodiment of the probability estimate rules of the present invention are described by this Verilog.

```
// Copyright 1997 RICOH
// PEM - probability estimation
// given Pstate, determine Pclass and possible next Pstates
module pem_expand (pstate, pclass, mps_pstate, lps_pstate, switch,
    update);
    input [8:0] pstate;
    output [3:0] pclass;
    output [8:0] mps_state;
    output [8:0] lps_pstate;
    output switch;
    output update;
    // registers only needed for behavioral simulation
    reg [3:0] pc;
    reg [8:0] ms;
    reg [8:0] ls;
    assign pclass = pc;
    assign mps_pstate = ms;
    assign lps_pstate = ls;
    assign switch = (pstate <= 4) || (pstate == 262) ? 1 : 0;
    // switch needs to be qualified with bit==LPS
    assign update = (pstate <= 214) ? 1 : 0;
    // update needs to be qualified with output data
    / /produced/consumed
    always @ (pstate)
        begin
            // conversion of PSTATE to PCLASS
            // $display ("PSTATE = %d",pstate);
            if (pstate <= 60) pc = 0;
            else if (pstate <= 86) pc = 1;
            else if (pstate <= 126) pc = 2;
            else if (pstate <= 157) pc = 3;
            else if (pstate <= 179) pc = 4;
            else if (pstate <= 212) pc = 5;
            else if (pstate <= 220) pc = 6;
            else if (pstate <= 228) pc = 7;
            else if (pstate <= 236) pc = 8;
            else if (pstate <= 241) pc = 9;
            else if (pstate <= 248) pc = 10;
            else if (pstate <= 252) pc = 11;
            else if (pstate <= 257) pc = 12;
            else if (pstate <= 259) pc = 13;
            else if (pstate <= 260) pc = 14;
            else if (pstate <= 261) pc = 15;
            else if (pstate <= 262) pc = 0;
            else if (pstate <= 263) pc = 2;
            else if (pstate <= 264) pc = 5;
            else if (pstate <= 265) pc = 7;
            else if (pstate <= 266) pc = 9;
            else if (pstate <= 267) pc = 10;
            else if (pstate <= 268) pc = 11;
```

```
        // Provides next PSTATE if MPS occurs
        if (pstate <= 33) ms = pstate + 5;
        else if (pstate <= 114) ms = pstate + 4;
        else if (pstate <= 195) ms = pstate + 3;
        else if (pstate <= 213) ms = pstate + 2;
        else if (pstate <= 220) ms = pstate + 1;
        else if (pstate <= 224) ms = pstate + 2;
        else if (pstate <= 236) ms = pstate + 1;
        else if (pstate <= 239) ms = pstate + 2;
        else if (pstate <= 248) ms = pstate + 1;
        else if (pstate <= 249) ms = pstate + 2;
        else if (pstate <= 260) ms = pstate + 1;
        else if (pstate == 261) ms = pstate + 0;
        else if (pstate <= 267) ms = pstate + 1;
        else if (pstate == 268) ms = pstate - 11;
        // Provides next PSTATE if LPS occurs
        if (pstate == 0) ls = pstate +5;
        else if (pstate == 1) ls = pstate + 3;
        else if (pstate == 2) ls = pstate + 1;
        else if (pstate == 3) ls = pstate + 1;
        else if (pstate == 4) ls = pstate - 3;
        else if (pstate <= 47) ls = pstate - 5;
        else if (pstate <= 128) ls = pstate - 6;
        else if (pstate <= 209) ls = pstate - 7
        else if (pstate <= 215) ls = pstate - 8;
        else if (pstate == 216) ls = pstate - 3;
        else if (pstate <= 220) ls = pstate - 2;
        else if (pstate == 223) ls = pstate - 1;
        else if (pstate <= 228) ls = pstate - 2;
        else if (pstate == 229) ls = pstate - 1;
        else if (pstate <= 236) ls = pstate - 2;
        else if (pstate == 239) ls = pstate - 1;
        else if (pstate <= 241) ls = pstate - 2;
        else if (pstate == 242) ls = pstate - 1;
        else if (pstate <= 248) ls = pstate - 2;
        else if (pstate <= 250) ls = pstate - 1;
        else if (pstate <= 252) ls = pstate - 2;
        else if (pstate == 253) ls = pstate - 1;
        else if (pstate <= 261) ls = pstate - 2;
        else if (pstate == 262) ls = pstate + 1;
        else if (pstate == 263) ls = pstate - 246;
        else if (pstate == 264) ls = pstate - 143;
        else if (pstate == 265) ls = pstate - 55;
        else if (pstate == 266) ls = pstate - 34;
        else if (pstate == 267) ls = pstate - 25;
        else if (pstate == 268) ls = pstate - 18;
    end
endmodule
```

Bit Generation

Figure 7:
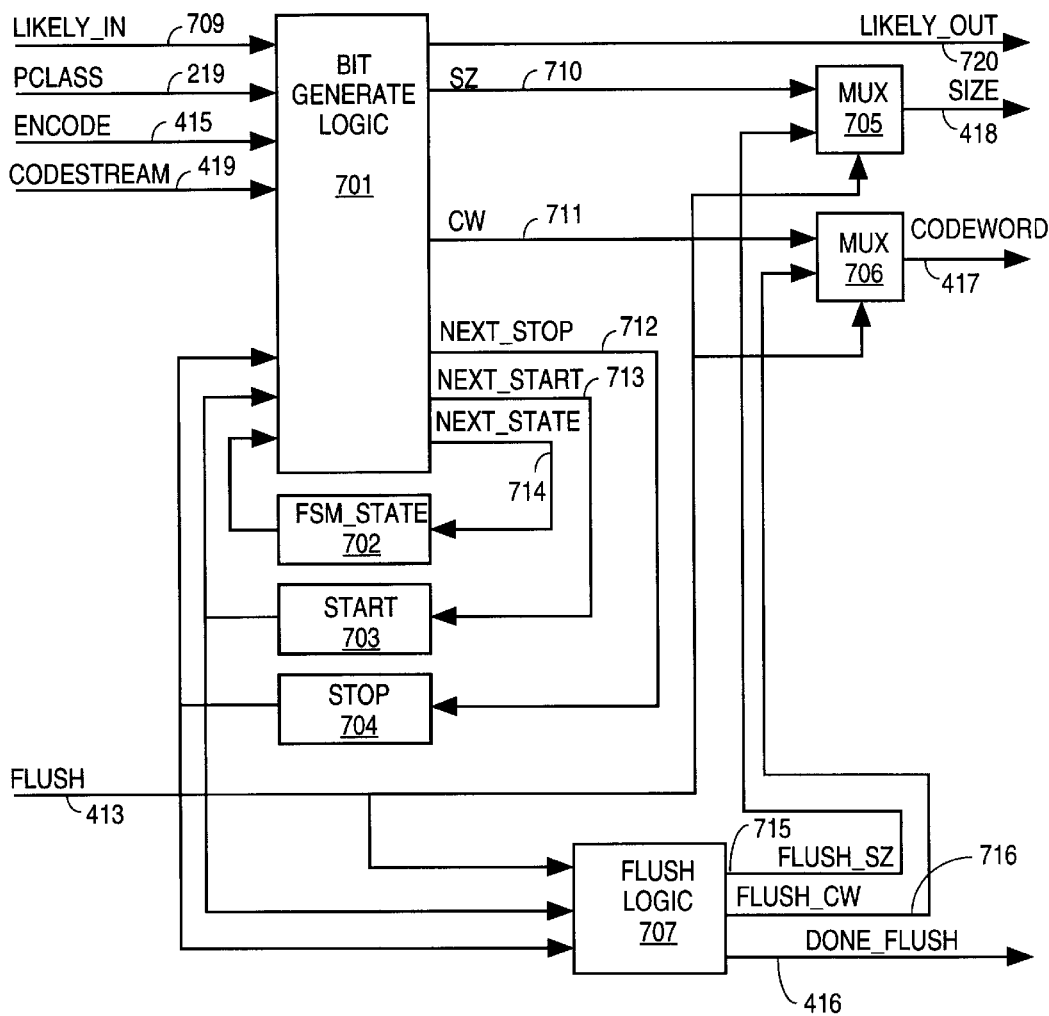
FIG. 7 is a block diagram of one embodiment of the bit_generate unit.

FIG. 7 is a block diagram of one embodiment of bit-generate unit 403 and performs the conversion between uncoded bits and coded bits. Most of the operation is performed by bit generate logic 701.

Referring to FIG. 7, bit generate logic 701 is coupled to receive likely_in indication 709, pclass 219, encode indication (e.g., signal(s)) 415 and codestream 419 along with outputs of registers 702–704, which include the fsm_state, a start value, and a stop value, respectively. Each of registers 702–704 is coupled to clock 410.

Fsm_state register 702 is the internal state of the FSM state machine. In one embodiment, fsm_state register 702 comprises a 6-bit register and is set to a predetermined state when reset is asserted. In one embodiment, the predetermined state is 0. Fsm_state input 702 is updated on clock cycles when enable 415 is asserted.

Start register 703 contains the smallest valid value that can be output to the codestream. In one embodiment, start register 703 comprises an 8-bit register. Start register 703 is set to a predetermined value when reset is asserted and is updated on clock cycles when enable indication 415 is asserted. In one embodiment, the predetermined value is 0.

Stop register 704 contains the largest valid value that can be output to the codestream. In one embodiment, stop register 704 comprises an 8-bit register. Stop register 704 is set to a predetermined value when reset is asserted and is updated on clock cycles when enable indication 415 is asserted. In one embodiment, stop register 704 is set to $11111111_2$ when reset.

In response to these inputs, bit generate logic 701 generates likely_out indication 223, sz indication 710, cw indication 711, next_stop value 712, next_start value 713, and next_state 714.

Sz indication 710 is coupled to one input of MUX 705. The other input to MUX 705 is coupled to flush_sz indication (e.g., signal(s)) 715. Similarly MUX 706 receives cw 711 on one input and flush_cw 716 from flush logic 707 on the other input.

In one embodiment, bit_generate unit 403 generates codewords for flushing at the end of encoding. Flush signal 413 is coupled to the select input of both MUXs 705 and 706. When the bit generator is not being flushed and, thus, flush signal 413 is not asserted, MUXs 705–706 output sz indication 710 as the size indication 418 and cw 711 as the codeword 417. On the other hand, when the bit generator is being flushed, and flush signal 413 is asserted, the predefined codewords represented by flush_cw 716 are output from MUX 706 as codeword 417 with a size indication set forth by flush_sz indication 715 being output as size 418.

Note that the bit generate logic 701 and flush logic 707 are described in further detail below.

Figure 8:
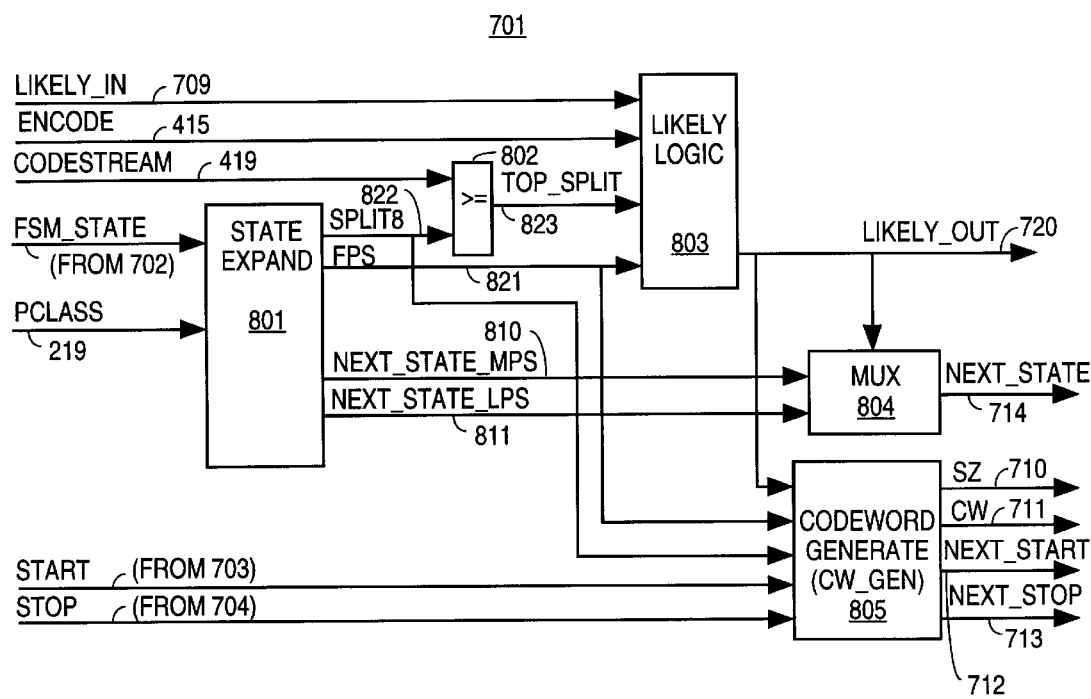
FIG. 8 is a block diagram of one embodiment of the bit generate logic.

FIG. 8 is a block diagram of one embodiment of bit generate logic 701. Referring to FIG. 8, bit generate logic 701 comprises state expand unit 801, comparator 802, likely logic 803, multiplexer 804 and codeword generate unit 805. State expand logic 801 is coupled to receive the fsm_state from register 702 and pclass 219. In response to these inputs, state expand unit 801 generates the first probable symbol (fps) indication (e.g., signal(s)) 821, split8 value 822, along with the next states for when a MPS or a LPS occurs, which are referred to as next_state_mps 810 and next_state_lps 811, respectively. One embodiment of state expand logic 801 is described in greater detail in conjunction with FIG. 9.

Comparator 802 is coupled to receive split8 value 822 and the codestream 419 and, in response thereto, generates a top_split signal 823. In one embodiment, if codestream 419 is greater than split8 value 822, top_split signal 823 is asserted (e.g., 1); on the other hand, if the codestream 419 is less than split8 value 822, top_split signal 823 is not asserted (e.g., 0).

Likely logic 803 is coupled to receive likely_in indication (e.g., signal(s)) 709 and encode indication 415, top_split signal 223, and fps indication 821. In response to these inputs, likely logic 803 operates in a similar manner to the bit logic in FIGS. 2 and 3 and generates a likely_out indication 720. This is substantially equivalent to likely indication 223. If encode indication 415 is a 1, then the output of likely_out indication 720 is likely_in indication 709; otherwise, if encode indication 415 is a 0, then the output of likely_out indication 720 comprises the XOR of fps signal 821 and top_split signal 823. Likely_out indication 720 is coupled to the selection input of MUX 804 as well as an input to codeword generate unit 805.

MUX 804 is coupled to receive next_state_mps 810 and next_state_lps 811. In one embodiment, next state 714 comprises next_state_mps 810 if likely_out indication 720 is asserted; otherwise, next_state_lps 811 is output as next_state 714.

Codeword generate unit 805 is coupled to receive fps signal 821, split8 value 822, the start value from register 703 and the stop value from register 704. In response to these inputs, codeword generate unit 805 generates sz indication 710, cw (codeword) 711, next_start value 712 and next_stop value 713. The codeword generation block is described in greater detail in conjunction with FIG. 13.

Note that state expand unit 801 and codeword generate (cw_gen) 805 generate outputs similar to the entropy coding table in FIG. 2, using logic to reduce hardware cost.

State Expand Logic

Figure 9:
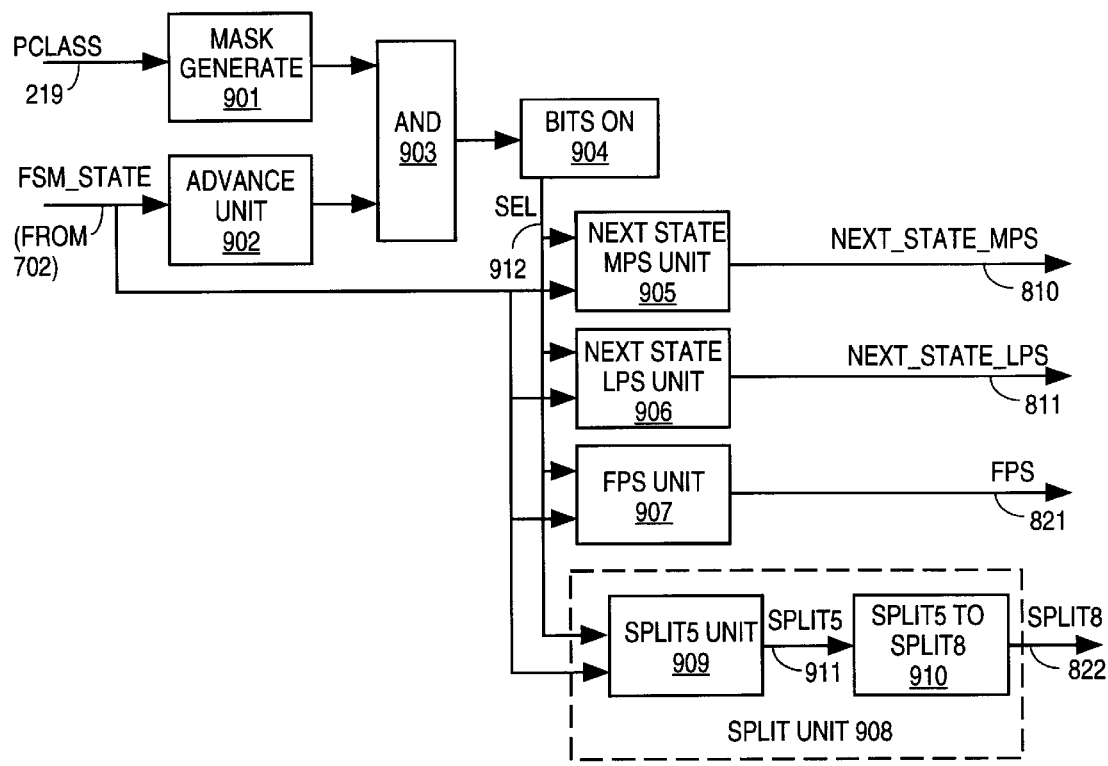
FIG. 9 is a block diagram of one embodiment of the state expand logic.

FIG. 9 is a block diagram of one embodiment of state expand logic 801. State expand logic 801 uses a multiple stage look-up to reduce hardware cost by eliminating redundant LUT entries.

Referring to FIG. 9, pclass 219 is coupled to the input of mask generate unit 901. The output of mask generate unit 901 is coupled to one input of AND gate 903. The fsm_state from register 702 is coupled to one input of advance unit 902 and one input of next_state_mps unit 905, next_state_lps unit 906, fps unit 907, and split unit 908. The output of advance unit 902 is coupled to the other input of AND gate 903. The output of AND gate 903 is coupled to bits_on unit 904. The output of bits_on unit 904 is coupled to the other input to next_state_mps unit 905, next_state_lps unit 906, fps unit 907 and split unit 908.

In response to these inputs, the next_state_mps unit 905 generates the next_state_mps 810, next_state_lps unit 906 generates the next_state_lps 811, and fps unit 907 generates fps signal 821. Also in response to its inputs, split unit 908 generates split8 value 822. Split unit comprises split5 unit 909 which is coupled to receive the inputs of split unit 908 and generates a split5 signal 911 in response thereto. Split5 signal 911 is coupled to the input of split5_to_split8 unit 910 which generates split8 value 822.

The first stage of the LUT is performed by advance unit 902. In one embodiment, advance unit 902 has one entry for each FSM (entropy coder) state and outputs the entry in response to receiving the fsm state from register 702. In one embodiment, advance unit 902 has 61 entries as follows (from left to right):

```
// advance.hex
7ecd 1552 1a64 0d08 0904 2545 0484 0445 1928 1521
0284 0492 0510 0044 0120 0210 1484 0208 0420 1220
0040 0291 0088 0110 0420 0910 0004 1484 0010 0468
1490 0620 010c 0020 0020 0004 0102 0244 0214 1a50
0684 0208 0004 0b40 0002 0114 0220 0022 02a4 0000
0424 0104 0024 030c 0214 0524 5e84 0020 1220 0a71
0324
```

In one embodiment, each entry is a 15 bit hexadecimal value. Each bit position corresponds to PCLASS 1 through 15 (there is no bit corresponding to probability class 0). A bit indicates if a PCLASS is coded the same as or different from the previous PCLASS (i.e., whether the LUT information is the same or different for consecutive PCLASSs). For example, state 0 has entry $7ECD_{16}$ or $111111011001101_2$. Starting from the right (LSB), there are zeros in portions 2, 5, 6, and 9. This means that PCLASS 2 is the same as PCLASS 1. Similarly, PCLASSs 4, 5 and 6 are the same and PCLASSs 8 and 9 are the same. One state is the same for every PCLASS (advance=$0000_{16}$); others have a small number of different PCLASSs. When many PCLASSs have the same LUT information, the logic to implement next_state_mps unit 905, next_state_lps unit 906, fps unit 907 and split5 unit 909 can be reduced.

Mask generate unit 901 generates a mask in response to pclass 219. In one embodiment, the mask is $000000000000000_2$ for PCLASS 0, $000000000000001_2$ for PCLASS 1, $000 0000 0000 0011_2$ for PCLASS 2, etc. The mask is ANDed by AND gate logic 903 with the output of advance unit 902.

Bits on unit 904 sums up the number of 1 bits output from AND gate logic 903 to generate sel value 912. Sel value 912 is used as an index for the second stage LUTs.

Next_state_mps unit 905, next_state_lps unit 906 and fps unit 907 complete the look-up of the corresponding values.

In one embodiment, next_state_mps unit 905 contains a LUT with the following entries (shown in hexadecimal), with each row corresponding to an FSM state (starting with FSM state 0). Note the second column follows below the first column.

```
// next_m.hex                    00 07 01 08 12 xx xx xx
00 03 05 01 08 02 37 04          00 05 07 01 xx xx xx xx
02 00 0b 03 05 07 27 xx          0e 01 00 2f xx xx xx xx
00 0c 07 01 08 12 1e xx          00 20 xx xx xx xx xx xx
01 00 0b 0f 19 xx xx xx          00 14 xx xx xx xx xx xx
00 01 02 37 xx xx xx xx          14 00 xx xx xx xx xx xx
1f 02 00 0b 03 28 2b xx          0d 01 2c xx xx xx xx xx
00 01 02 37 xx xx xx xx          00 20 21 17 xx xx xx xx
02 30 00 03 05 xx xx xx          05 21 15 18 xx xx xx xx
00 18 05 01 1f 3a xx xx          00 0b 03 05 07 13 xx xx
25 00 0c 16 1d 3b xx xx          17 00 0b 0f 03 xx xx xx
00 0e 1c 2d xx xx xx xx          09 00 36 xx xx xx xx xx
20 01 02 00 2e xx xx xx          0c 02 xx xx xx xx xx xx
01 15 18 26 xx xx xx xx          00 0b 19 03 28 xx xx xx
00 14 22 xx xx xx xx xx          0d 03 xx xx xx xx xx xx
00 23 33 xx xx xx xx xx          00 23 0e 1c xx xx xx xx
01 00 0b xx xx xx xx xx          01 02 00 xx xx xx xx xx
00 01 02 04 06 xx xx xx          23 01 00 xx xx xx xx xx
09 00 35 xx xx xx xx xx          00 20 21 17 25 xx xx xx
00 01 08 xx xx xx xx xx          00 xx xx xx xx xx xx xx
00 03 05 07 xx xx xx xx          00 29 09 34 xx xx xx xx
00 31 xx xx xx xx xx xx          22 00 23 xx xx xx xx xx
00 11 17 25 30 xx xx xx          02 2a 16 xx xx xx xx xx
02 15 0c xx xx xx xx xx          16 34 04 24 1a xx xx xx
00 20 21 xx xx xx xx xx          16 34 04 2a xx xx xx xx
03 15 3c xx xx xx xx xx          00 03 01 08 02 xx xx xx
01 00 0b 0f xx xx xx xx          00 01 02 37 04 06 10 1b
0c 02 xx xx xx xx xx xx          01 24 xx xx xx xx xx xx
00 01 02 04 10 xx xx xx          00 05 01 1f xx xx xx xx
00 0e xx xx xx xx xx xx          21 06 15 26 0c 16 1d xx
04 15 18 0c 16 xx xx xx          0b 21 25 30 15 xx xx xx
```

For each of the 61 states, there are 8 entries for up to 8 possible values of sel value 912. If less than 8 values of sel value 912 occur for a particular state (because many PCLASSs use the same information), "don't care" values are indicated by "xx". More than 8 values of sel value occur for state 0, the first 8 entries for the next state of MPS are shown in the table above and the remaining ones are $6_{16}$, $10_{16}$, $1B_{16}$ and $38_{16}$, respectively.

One embodiment of next_state_lps unit 906 contains a LUT with the following entries (shown in hexadecimal), with each row corresponding to an FSM state. Again, the second column follows the first.

```
// next_l.hex                    07 1a 02 01 00 xx xx xx
00 09 29 00 09 00 09 00          0b 0e 0d 00 xx xx xx xx
11 00 09 00 00 00 00 xx          00 0d 00 00 xx xx xx xx
01 00 09 00 00 00 00 xx          00 00 xx xx xx xx xx xx
0a 00 00 00 xx xx xx xx          01 00 xx xx xx xx xx xx
02 01 00 00 xx xx xx xx          00 xx xx xx xx xx xx xx
39 24 01 15 00 00 00 xx          15 00 00 xx xx xx xx xx
04 02 01 00 xx xx xx xx          01 15 00 00 xx xx xx xx
1a 00 02 01 00 xx xx xx          00 25 01 00 xx xx xx xx
03 00 0a 00 00 00 xx xx          06 1d 04 02 01 00 xx xx
```

-continued

| | |
|---|---|
| 29 00 00 00 00 00 xx xx | 00 03 21 0a 00 xx xx xx |
| 00 00 00 00 xx xx xx xx | 0a 00 00 xx xx xx xx xx |
| 00 0e 0d 00 00 xx xx xx | 0a 00 xx xx xx xx xx xx |
| 00 00 00 00 xx xx xx xx | 05 25 24 01 00 xx xx xx |
| 00 00 00 xx xx xx xx xx | 21 00 xx xx xx xx xx xx |
| 00 00 00 xx xx xx xx xx | 02 0c 01 00 xx xx xx xx |
| 1c 01 00 xx xx xx xx xx | 23 14 00 xx xx xx xx xx |
| 06 04 02 01 00 xx xx xx | 00 14 00 xx xx xx xx xx |
| 0d 00 00 xx xx xx xx xx | 02 0c 01 15 00 xx xx xx |
| 05 01 00 xx xx xx xx xx | 00 xx xx xx xx xx xx xx |
| 04 02 01 00 xx xx xx xx | 09 15 00 00 xx xx xx xx |
| 00 00 xx xx xx xx xx xx | 00 01 00 xx xx xx xx xx |
| 00 01 09 00 00 xx xx xx | 09 15 00 xx xx xx xx xx |
| 00 01 00 xx xx xx xx xx | 0d 14 00 01 00 xx xx xx |
| 03 21 00 xx xx xx xx xx | 0a 0e 00 00 xx xx xx xx |
| 00 00 00 xx xx xx xx xx | 08 18 03 21 00 xx xx xx |
| 2d 02 01 00 xx xx xx xx | 1b 10 06 1d 04 02 01 00 |
| 0d 00 xx xx xx xx xx xx | 32 09 xx xx xx xx xx xx |
| 10 06 04 02 00 xx xx xx | 0f 1c 01 00 xx xx xx xx |
| 01 00 xx xx xx xx xx xx | 1d 00 04 2a 02 01 00 xx |
| 00 02 0c 01 00 xx xx xx | 00 20 0e 0d 00 xx xx xx |

For each of the 61 states, there are 8 entries for up to 8 possible values of sel value 912. If less than 8 values of sel value 912 occur for a particular state, "don't care" values are indicated by "xx". More than 8 values of sel value 912 occur for state 0, the first 8 entries for the next state on MPS are shown in the table above and the remaining ones are all 0.

In one embodiment, fps unit 907 contains a LUT with the following entries, with the second and third columns following the first and second columns respectively. Again, each row corresponds to a different FSM state.

| | | |
|---|---|---|
| // first.hex | 1 1 x x x x x x | 0 0 1 x x x x x |
| 0 1 1 1 1 1 1 1 | 1 0 1 1 1 x x x | 0 0 x x x x x x |
| 1 1 1 1 1 1 1 x | 0 1 1 x x x x x | 1 1 1 1 1 x x x |
| 1 0 1 1 1 1 1 x | 1 1 1 x x x x x | 1 0 x x x x x x |
| 1 1 1 1 1 x x x | 0 1 1 x x x x x | 1 1 1 1 x x x x |
| 1 1 1 1 x x x x | 1 1 1 1 x x x x | 1 1 1 x x x x x |
| 1 1 1 1 1 1 1 x | 0 0 x x x x x x | 0 1 1 x x x x x |
| 1 1 1 1 x x x x | 1 1 1 1 x x x x | 1 1 1 1 1 x x x |
| 1 0 1 1 1 x x x | 1 1 x x x x x x | 1 x x x x x x x |
| 1 0 1 1 1 1 x x | 0 1 1 1 x x x x | 0 0 0 1 x x x x |
| 1 0 1 1 1 1 x x | 1 1 1 1 1 x x x | 0 1 1 x x x x x |
| 1 1 1 1 x x x x | 1 1 1 1 x x x x | 0 0 0 x x x x x |
| 0 1 1 1 1 x x x | 0 1 1 1 x x x x | 0 0 0 1 1 x x x |
| 0 1 1 1 1 x x x | 1 1 x x x x x x | 0 0 0 1 x x x x |
| 1 1 1 x x x x x | 1 1 x x x x x x | 1 1 1 1 1 x x x |
| 1 1 1 x x x x x | 0 1 x x x x x x | 1 1 1 1 1 1 1 1 |
| 1 1 1 x x x x x | 1 0 x x x x x x | 0 0 x x x x x x |
| 1 1 1 1 1 x x x | 1 1 1 1 x x x x | 1 1 1 1 x x x x |
| 0 0 1 x x x x x | 0 1 1 1 x x x x | 1 0 1 1 1 1 1 x |
| 1 1 1 x x x x x | 1 1 1 1 1 1 x x | 0 1 1 1 1 x x x |
| 1 1 1 1 x x x x | 0 1 1 1 1 x x x | |

For each of the 61 states, there are 8 entries for up to 8 possible values of sel value 912. If less than 8 values of sel value 912 occur for a particular state, "don't care" values are indicated by "x". More than 8 values of sel value 912 occur for state 0, the first 8 entries for the next state on MPS are shown in the table above and the remaining one are all 1.

Split5 unit 909 does a look up that generates a 5 bit split index, which is then expanded by split5_to_split8 logic 910 to generate the proper 8 bit split value, split8 value 822. Split5 unit 909 contains a LUT with the following 5-bit entries (shown in hexadecimal), with the second column following the first column.

| | |
|---|---|
| // split.hex | 05 10 13 16 17 xx xx xx |
| 05 0c 0f 13 16 19 1a 1b | 05 0f 10 13 xx xx xx xx |
| 04 05 09 0c 0f 10 12 xx | 02 04 05 07 xx xx xx xx |
| 05 01 10 13 16 17 18 xx | 05 09 xx xx xx xx xx xx |
| 02 05 09 0a 0b xx xx xx | 05 07 xx xx xx xx xx xx |
| 05 13 19 1a xx xx xx xx | 04 05 xx xx xx xx xx xx |
| 03 04 05 09 0c 0d 0e xx | 09 05 0d xx xx xx xx xx |
| 05 13 19 1b xx xx xx xx | 05 09 0c 0d xx xx xx xx |
| 04 01 05 0c 0f xx xx xx | 05 0c 13 16 xx xx xx xx |
| 05 01 0f 13 14 15 xx xx | 05 09 0c 0f 10 11 xx xx |
| 0f 05 19 1b 1c 1d xx xx | 01 05 09 0a 0c xx xx xx |
| 05 09 0a 0b xx xx xx xx | 0c 05 1c xx xx xx xx xx |
| 01 02 04 05 07 xx xx xx | 0c 05 xx xx xx xx xx xx |
| 05 13 16 17 xx xx xx xx | 05 09 0b 0c 0d xx xx xx |
| 05 07 08 xx xx xx xx xx | 09 05 xx xx xx xx xx xx |
| 05 07 08 xx xx xx xx xx | 05 07 09 0a xx xx xx xx |
| 02 05 09 xx xx xx xx xx | 02 04 05 xx xx xx xx xx |
| 05 13 19 1b 1c xx xx xx | 02 04 05 xx xx xx xx xx |
| 09 05 11 xx xx xx xx xx | 05 09 0c 0d 0f xx xx xx |
| 05 13 16 xx xx xx xx xx | 05 xx xx xx xx xx xx xx |
| 05 0c 0f 10 xx xx xx xx | 05 02 01 0b xx xx xx xx |
| 05 06 xx xx xx xx xx xx | 04 05 07 xx xx xx xx xx |
| 05 04 0d 0f 10 xx xx xx | 05 02 01 xx xx xx xx xx |
| 05 13 19 xx xx xx xx xx | 04 05 07 xx xx xx xx xx |
| 05 09 0c xx xx xx xx xx | 05 02 01 xx xx xx xx xx |
| 05 13 19 xx xx xx xx xx | 09 07 05 0f 10 xx xx xx |
| 05 09 0c xx xx xx xx xx | 0c 09 05 1b xx xx xx xx |
| 05 13 14 xx xx xx xx xx | 05 0c 13 16 19 xx xx xx |
| 02 05 09 0a xx xx xx xx | 05 13 19 1a 1b 1c 1d 1e |
| 09 05 xx xx xx xx xx xx | 05 04 xx xx xx xx xx xx |
| 05 13 19 1b 1d xx xx xx | 05 0f 13 14 xx xx xx xx |
| 05 09 xx xx xx xx xx xx | 0c 05 13 17 19 1b 1c xx |
| 05 13 16 19 1b xx xx xx | 05 0c 0f 10 13 xx xx xx |

For each of the 61 states, there are 8 entries for up to 8 possible values of sel value 912. If less than 8 values of sel value 912 occur for a particular state, "don't care" values are indicated by "xx". More than 8 values of sel value 912 occur for state 0, the first 8 entries for the next state on MPS are shown in the table above and the remaining ones are $1C_{16}$, $1D_{16}$, $1E_{16}$ and $1F_{16}$ respectively.

The 5-bit indices are converted into 8-bit split values by split5_to_split8 unit 910. Split5_to_split8 unit 910 uses the following LUT (with entries shown in hexadecimal). For example, for state 0 and sel 0, the first split point index is $05_{16}$ which corresponds to a value of $80_{16}$. The $05_{16}$ value appears in upper left value of the split.hex value above. The $80_{16}$ value is derived from position $05_{16}$ in the split58.hex list below (i.e., the 6$^{th}$ position from the start of the list where "xx" is the $00_{16}$ position).

```
// split58.hex
// 5-bit split point indices to true 8-bit values
xx 40 60 64 70 80 84 88 8c 90 98 9c a0 a8 ac b0 b8 bc be c0 c8 cc d0 d8
dc e0 e8 f0 f8 fc fe ff
```

Next_state_mps unit 905, next_state_lps unit 906, fps unit 907 and split5 unit 909 may be implemented assuming that both the fsm_state from register 702 and sel value 912 are both valid at the start of operation. In this case, each unit produces a single output. Alternatively, speed may be increased if a two step process is used for each unit. First, the fsm_state is used to determine the output for all possible values of sel value 912. Second, sel value 912 is used to multiplex the correct possible output to the output. Since fsm_state will be valid before sel value 912, this may allow higher speed.

The following example illustrates the operation of one embodiment of the FSM coder. Table 3 summarizes the results below. Initially, the coder starts in pstate 262 for every context with the PCLASS equal to 0, the MPS equal to 0 and the FSM state equal to 0. A context of 6 and an input bit of 0 are received at the inputs of the FSM coder. (Contexts and bits in this example are picked arbitrarily.) PCLASS 0 implies sel value 912 equals 0. With sel value 912 equal to 0 and an FSM state equal to 0, a 5 bit split index value is obtained. Note that this value is obtained from the split.hex table above where each row corresponds to an FSM state (starting with the first row corresponding to FSM state 0).

Using the split58.hex table, the five bit split point index is converted into a split value of 80 hex. Therefore, the interval that runs from 0-FF is split at 80 hex such that one interval is set from 0-7F and the other interval from 80-FF. The fps signal indicates which of the intervals 0-FF or 80-FF is associated with the occurrence of an MPS. To determine which side is associated with the MPS, the fps signal is evaluated. In this case, the fps signal is 0. This is determined by looking at first.hex and examining the first row corresponding to an FSM state equal to 0, causing selection of the first row of the table and sel 912 equal to 0 the first bit position of the first bit in that row. In this case, because the fps signal is 0, the MPS is associated with the upper interval of 80-FF. Because the input bit is in the likely state (i.e., the input bit is the same as the MPS), the interval from 80-FF is evaluated. When comparing the most significant bits of bits of the upper bound, FF, and lower bound, 80, of the interval, the first bit is 1 in both cases. Therefore, a 1 bit is output.

Because the pstate is greater than or equal to 214 and there is an output, the PSTATE is updated. The update is based on the current contents of the table and is updated to state 263. As for the FSM state, it remains in FSM state 0 since $00_{16}$ is in the first position (sel value 912=0) of the first row (FSM state=0) of the next_m.hex table.

Next, the interval is changed and a new interval is created by shifting the remaining bits that have not been output from the interval. For instance, all the bits representing the lower interval endpoint that were not output as a result of the codewords output are shifted to the left and 0 bits are shifted into the least significant bits. Since the first zero bit has been output and seven zero bits remain, all of the seven least significant bits are shifted to the left one bit location and a 0 is added into the LSB. Similarly, with respect to the upper end of the interval, 7F, all of the remaining bits include 1111111, which are shifted to the left one bit and another 1 bit is added to the least significant bit of the interval. This results in a new interval of 00-FF (state 0 means the interval is 00-FF).

The next context and bit entered are 6 and 0 respectively while the PSTATE is 263. A PSTATE of 263 corresponds to a PCLASS of 2. In response to pclass 219 being 2, mask generate 901 outputs a mask value equal to 000000000000011. In response to an FSM state equal to 0, advance unit 902 outputs the entry corresponding to FSM state 0, which is $7ECD_{16}$, or $111111011001101_2$. The results of ANDing the output of mask generate 901 and advance unit 902 are 000000000000001. In response to this value, bits_on unit 904 generates a sel value 912 equal to 1. Thus, with FSM state equal to 0 and sel value 912 equal to 1, a split index of 0C is obtained from split.hex. This corresponds to an eight bit split value of A0. Therefore, the two intervals run from 00-9F and A0-FF.

With a FSM state of 0 and sel value 912 equal to 1, the second position of the first row of first.hex indicates that the fps signal 821 is a 1. With a fps signal 821 being a 1, the interval associated with the more likely case is the interval from 00-BF. This interval is selected for evaluation because the input bit is the same as the MPS (i.e., it is in its more likely state). Because the most significant bit of the start of this interval (00) does not match the most significant bit at the end of the interval (A0), there are no bits that are output and the system transitions to a new FSM state as indicated by next.m.hex (state 3 as indicated at the second position (sel value 912=1) of row 0 (FSM state=0)) while the PSTATE remains the same. Note that because no bits are output, no shifting in of bits into the interval endpoints is performed.

The next inputs are a context bit of 6 and an input bit 0. Based on the inputs, a split value of 60 hex occurs. This split value is applied to the previously selected interval of 00 to BF. Therefore, the 00-9F interval is split between 00-5F and 60-9F. The fps signal indicates that the first portion of the first interval from 0-5F is the likely interval. Because an MPS was received as the input bit, this first interval from 0-5F is evaluated. In this case, the first bit of the endpoints of the interval 0 and 5F match and is therefore output. After outputting the bit, the remaining bits of the interval values are shifted to the left and a 0 is added to the lower interval (creating a 00 endpoint), and a 1 is added to the upper interval (creating a BF endpoint), such that the new interval becomes 0-BF.

This processing of input data continues as shown in the table below. However, an interesting example occurs when the context is 6 and the input bit is a 1. In this case, the interval runs from 0-C7 with a split value of C0 (from split58.hex) Based on the fps signal, the likely interval is from C0 to C7. In this case, the most significant 5 bits of both the start and endpoint of this interval match and would be output ($11000_2$). After outputting the five bits, the remaining bits of both the start and stop intervals are shifted to the left with 0's filling the lower order bits of the low end of the interval and 1's filling the lower order bit locations of the upper interval. This results in a new interval of 0-FF.

TABLE 3

Example Data (cw = codeword)

| context, bit | pstate | mps | pclass | fsm_state | start | stop | split5 | split8 | fps | cw | size |
|---|---|---|---|---|---|---|---|---|---|---|---|
| dec,dec | dec | | dec | dec | hex | hex | hex | hex | | hex | dec |
| 6,0 | 262 | 0 | 0 | 0 | 00 | ff | 05 | 80 | 0 | 01 | 1 |
| 6,0 | 263 | 0 | 2 | 0 | 00 | ff | 0c | a0 | 1 | 00 | 0 |
| 6,0 | 263 | 0 | 2 | 3 | 00 | 9f | 02 | 60 | 1 | 00 | 1 |
| 6,0 | 264 | 0 | 5 | 1 | 00 | bf | 09 | 90 | 1 | 00 | 0 |
| 6,0 | 264 | 0 | 5 | 11 | 00 | 8f | 04 | 70 | 1 | 00 | 1 |
| 6,0 | 265 | 0 | 7 | 2 | 00 | df | 13 | c0 | 1 | 00 | 0 |

TABLE 3-continued

Example Data (cw = codeword)

| context, bit | pstate | mps | pclass | fsm_state | start | stop | split5 | split8 | fps | cw | size |
|---|---|---|---|---|---|---|---|---|---|---|---|
| 6,0 | 265 | 0 | 7 | 1 | 00 | bf | 0c | a0 | 1 | 00 | 0 |
| 6,0 | 265 | 0 | 7 | 3 | 00 | 9f | 05 | 80 | 1 | 00 | 1 |
| 6,0 | 266 | 0 | 9 | 0 | 00 | ff | 19 | e0 | 1 | 00 | 0 |
| 6,0 | 266 | 0 | 9 | 2 | 00 | df | 13 | c0 | 1 | 00 | 0 |
| 6,0 | 266 | 0 | 9 | 1 | 00 | bf | 0f | b0 | 1 | 00 | 0 |
| 6,0 | 266 | 0 | 9 | 5 | 00 | af | 0c | a0 | 1 | 00 | 0 |
| 6,0 | 266 | 0 | 9 | 3 | 00 | 9f | 09 | 90 | 1 | 00 | 0 |
| 6,0 | 266 | 0 | 9 | 11 | 00 | 8f | 05 | 80 | 1 | 00 | 1 |
| 6,0 | 267 | 0 | 10 | 0 | 00 | ff | 1a | e8 | 1 | 00 | 0 |
| 6,0 | 267 | 0 | 10 | 55 | 00 | e7 | 16 | d0 | 1 | 00 | 0 |
| 6,0 | 267 | 0 | 10 | 8 | 00 | cf | 13 | c0 | 1 | 00 | 0 |
| 6,0 | 267 | 0 | 10 | 1 | 00 | bf | 0f | b0 | 1 | 00 | 0 |
| 6,0 | 267 | 0 | 10 | 5 | 00 | af | 0c | a0 | 1 | 00 | 0 |
| 6,0 | 267 | 0 | 10 | 3 | 00 | 9f | 09 | 90 | 1 | 00 | 0 |
| 6,0 | 267 | 0 | 10 | 11 | 00 | 8f | 05 | 80 | 1 | 00 | 1 |
| 6,0 | 268 | 0 | 11 | 0 | 00 | ff | 1b | f0 | 1 | 00 | 0 |
| 6,0 | 268 | 0 | 11 | 4 | 00 | ef | 19 | e0 | 1 | 00 | 0 |
| 6,0 | 268 | 0 | 11 | 2 | 00 | df | 16 | d0 | 1 | 00 | 0 |
| 6,0 | 268 | 0 | 11 | 8 | 00 | cf | 13 | c0 | 1 | 00 | 0 |
| 6,0 | 268 | 0 | 11 | 1 | 00 | bf | 10 | b8 | 1 | 00 | 0 |
| 6,0 | 268 | 0 | 11 | 7 | 00 | b7 | 0f | b0 | 1 | 00 | 0 |
| 6,0 | 268 | 0 | 11 | 5 | 00 | af | 0d | a8 | 1 | 00 | 0 |
| 6,0 | 268 | 0 | 11 | 40 | 00 | a7 | 0c | a0 | 1 | 00 | 0 |
| 6,0 | 268 | 0 | 11 | 3 | 00 | 9f | 0a | 98 | 1 | 00 | 0 |
| 6,0 | 268 | 0 | 11 | 15 | 00 | 97 | 09 | 90 | 1 | 00 | 0 |
| 6,0 | 268 | 0 | 11 | 11 | 00 | 8f | 07 | 88 | 1 | 00 | 0 |
| 6,0 | 268 | 0 | 11 | 46 | 00 | 87 | 05 | 80 | 1 | 00 | 1 |
| 6,0 | 257 | 0 | 12 | 0 | 00 | ff | 1c | f8 | 1 | 00 | 0 |
| 6,0 | 257 | 0 | 12 | 6 | 00 | f7 | 1b | f0 | 1 | 00 | 0 |
| 6,0 | 257 | 0 | 12 | 4 | 00 | ef | 1a | e8 | 1 | 00 | 0 |
| 6,0 | 257 | 0 | 12 | 55 | 00 | e7 | 19 | e0 | 1 | 00 | 0 |
| 6,0 | 257 | 0 | 12 | 2 | 00 | df | 17 | d8 | 1 | 00 | 0 |
| 6,0 | 257 | 0 | 12 | 18 | 00 | d7 | 16 | d0 | 1 | 00 | 0 |
| 6,0 | 257 | 0 | 12 | 8 | 00 | cf | 14 | c8 | 1 | 00 | 0 |
| 6,1 | 257 | 0 | 12 | 31 | 00 | c7 | 13 | c0 | 1 | 18 | 5 |

So far the bits output are 100000011000, so the first byte, 81 in hexidecimal, can be output.

| | | | | | | | | | | | |
|---|---|---|---|---|---|---|---|---|---|---|---|
| 9,1 | 262 | 0 | 0 | 0 | 00 | ff | 05 | 80 | 0 | 00 | 1 |
| 0,0 | 262 | 0 | 0 | 0 | 00 | ff | 05 | 80 | 0 | 01 | 1 |
| 6,0 | 255 | 0 | 12 | 0 | 00 | ff | 1c | f8 | 1 | 00 | 0 |
| 6,0 | 255 | 0 | 12 | 6 | 00 | f7 | 1b | f0 | 1 | 00 | 0 |
| 6,0 | 255 | 0 | 12 | 4 | 00 | ef | 1a | e8 | 1 | 00 | 0 |
| 6,0 | 255 | 0 | 12 | 55 | 00 | e7 | 19 | e0 | 1 | 00 | 0 |
| 6,0 | 255 | 0 | 12 | 2 | 00 | df | 17 | d8 | 1 | 00 | 0 |
| 6,0 | 255 | 0 | 12 | 18 | 00 | d7 | 16 | d0 | 1 | 00 | 0 |
| 6,0 | 255 | 0 | 12 | 8 | 00 | cf | 14 | c8 | 1 | 00 | 0 |
| 6,0 | 255 | 0 | 12 | 31 | 00 | c7 | 13 | c0 | 1 | 00 | 0 |
| 6,0 | 255 | 0 | 12 | 1 | 00 | bf | 10 | b8 | 1 | 00 | 0 |
| 6,0 | 255 | 0 | 12 | 7 | 00 | b7 | 0f | b0 | 1 | 00 | 0 |
| 6,1 | 255 | 0 | 12 | 5 | 00 | af | 0d | a8 | 1 | 15 | 5 |
| 9,1 | 263 | 1 | 2 | 0 | 00 | ff | 0c | a0 | 1 | 00 | 0 |
| 0,1 | 263 | 0 | 2 | 3 | 00 | 9f | 02 | 60 | 1 | 00 | 0 |
| 13,0 | 262 | 0 | 0 | 10 | 60 | 9f | 05 | 80 | 1 | 03 | 3 |
| 25,0 | 262 | 0 | 0 | 0 | 00 | ff | 05 | 80 | 0 | 01 | 1 |
| 137,0 | 262 | 0 | 0 | 0 | 00 | ff | 05 | 80 | 0 | 01 | 1 |
| 6,1 | 253 | 0 | 0 | 0 | 00 | ff | 1c | f8 | 1 | 1f | 5 |
| 12,0 | 262 | 0 | 12 | 0 | 00 | ff | 05 | 80 | 0 | 01 | 1 |
| 12,0 | 263 | 0 | 0 | 0 | 00 | ff | 0c | a0 | 1 | 00 | 0 |
| 12,0 | 263 | 0 | 2 | 3 | 00 | 9f | 02 | 60 | 1 | 00 | 1 |
| 12,1 | 264 | 0 | 5 | 1 | 00 | bf | 09 | 90 | 1 | 02 | 2 |
| 0,1 | 263 | 0 | 2 | 9 | 40 | ff | 05 | 80 | 0 | 01 | 2 |
| 6,1 | 252 | 0 | 11 | 0 | 00 | ff | 1b | f0 | 1 | 0f | 4 |
| 9,0 | 263 | 1 | 2 | 0 | 00 | ff | 0c | a0 | 1 | 01 | 1 |
| 9,1 | 17 | 1 | 0 | 9 | 40 | ff | 0f | b0 | 1 | 00 | 0 |
| 0,1 | 17 | 0 | 0 | 37 | 40 | af | 05 | 80 | 1 | 02 | 2 |

-continued

| | | | | | | | | | | | |
|---|---|---|---|---|---|---|---|---|---|---|---|
| 9,0  | 22  | 1 | 0  | 1  | 00 | bf | 04 | 70 | 1 | 00 | 0 |
| 25,1 | 263 | 0 | 2  | 17 | 00 | bf | 09 | 90 | 0 | 00 | 0 |
| 3,1  | 262 | 0 | 0  | 13 | 70 | 8f | 05 | 80 | 1 | 08 | 4 |
| 6,0  | 250 | 0 | 11 | 0  | 00 | ff | 1b | f0 | 1 | 00 | 0 |

Although embodiments of the encoder using the fps and split values are described, the encoder may be implemented in software using similar indications. While in hardware, an XOR operation with the fps signal is relatively simple to implement; however, in the case of software in some computer architectures, there is a difficulty because determining whether a number is greater than or equal to another results in the setting of a status bit, not just a readily accessible bit. The operation of XORing or comparing a bit with a status bit is only performed by performing branch operations which branch to different locations based on whether the status bit is a 1 or 0 and then accessing a register at each location that is loaded with either the 1 or the 0 representing the status bit indication. A pseudo code example of such software is given below:

```
          compare codestream,split8
          branch greater than or equal Label 1
          load 0 into Register
          branch Label 2
Label 1:  load 1 into Register
Label 2:  compare Register, FPS
          branch greater or equal LPS
          ;MPS
```

This is a very cumbersome implementation.

In software, to overcome these difficulties, two split values may be generated for the cases where fps is 0 and fps is 1. Since the fps signal equal the 1 occurs a high percentage of a time, only one comparison may have to be performed to obtain an XORed result (instead of the two that are required in the hardware implementation). However, if the one comparison does not provide the necessary results, then two additional comparisons are required, which is more than the two used in hardware, with a final comparison between the input and the MPS is performed to determine if they match (likely). An example of psuedo code for this software is given below where two split values, one for the fps indication being a 1 (split8_fps1) and one for the fps indication being a 0 (split8_fps0), are used.

```
compare codestream,split8_fps1
branch less than MPS ;most likely case
compare split8_fps1,0
branch not equal LPS
compare codestream,split8_fps0
branch greater than or equal MPS
;LPS
```

Flushing

There are several possible implementations of flush logic 707.

Figure 11:
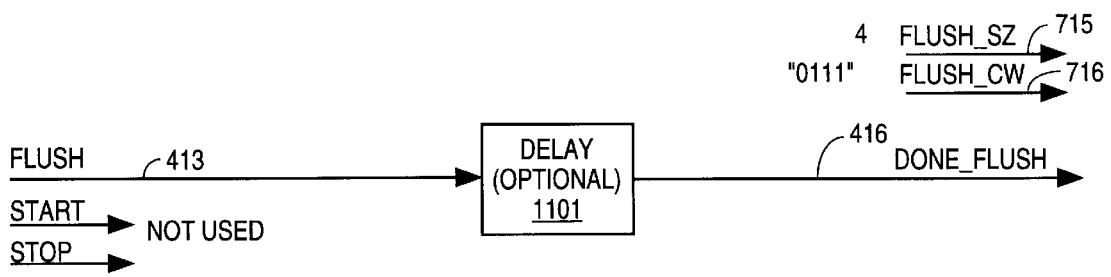
FIG. 11 is a block diagram of one embodiment of the flush logic for flushing in one cycle.

FIG. 11 is a block diagram of one embodiment of flush logic 707 for flushing in one cycle with the value $0111_2$. Alternatively, a longer value such as $10000000_2$ could be used. Referring to FIG. 11, delay 1101 is coupled to receive the flush signal 413 and output done_flush indication 416. In one embodiment, flushing takes one cycle. Again, in this case, flush_sz indication 715 is set to 4 and flush_cw 716 is set to four bits 0111. Again the start and stop values from start register 703 and stop register 704 are not used.

Figure 12:
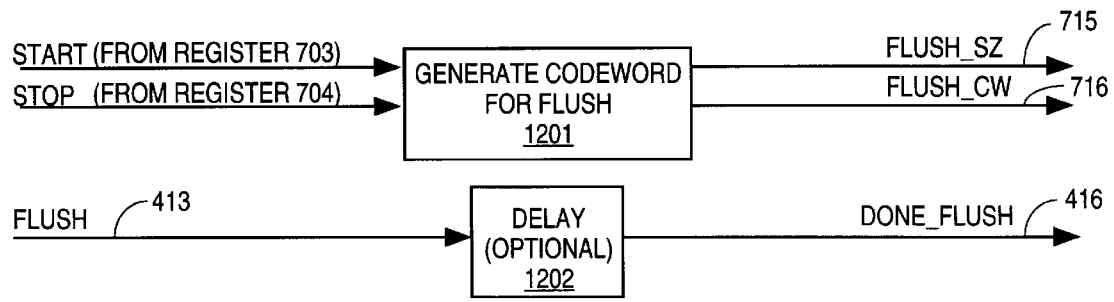
FIG. 12 illustrates a block diagram of flush logic for flushing in one cycle with the codeword determined by the current interval.

To flush with the minimum number of bits, the codeword used to flush can be determined by the start and stop values, as shown in FIG. 12. Referring to FIG. 12, generate_codeword_for_flush unit 1201 is coupled to receive the start value from register 703 and the stop value from register 704. In response to these outputs, unit 1201 outputs flush_sz indication 715 and flush_cw 716. Also, delay unit 1202 is coupled to receive flush signal 413 and output done_flush indication 416. Generate_codeword_for_flush unit 1201 operates as follows.

```
if ((start == 0) && (stop = $FF))
        flush_sz = 0
        flush_cw = x
else if (start == 0)
        flush_sz = 1
        flush_cw = 0
else if (stop == $ff)
        flush_sz = 1
        flush_cw = 1
else if ((start == $20) OR (start == $40))
        flush_sz = 2
        flush_cw = 01
else if (stop >= $BF)
        flush_sz = 2
        flush_cw = 10
else if (start == $60)
        flush_sz = 3
        flush_cw = 011
else if (stop >= $9F)
        flush_sz = 3
        flush_cw = 100
else
        flush_sz = 4
        flush_cw = 0111
```

In an alternative embodiment, flushing may be performed by coding 8 bits in PCLASS 0. This does not require any logic in the FSM coder. The context model/probability estimation/system control performs the flushing.

Bit Generation Verilog

Below is an exemplary Verilog HDL description for FIGS. 8, 9 and 11.

```
// Copyright 1997 RICOH
// This is the Finite State Machine (B-coder) bit generator
// Give the probability class, it converts likely/unlikely to/from
// the variable length bitstream
module bit_generate (clock, reset, likely_in, pclass, encode, codestream,
    enable, flush,
    size, likely_out, codeword, done_flush);
    input clock;
    input reset;
    input likely_in;
    input [3:0] pclass;
    input encode;
    input [7:0] codestream;
    input enable;
```

-continued

```
input flush;
output [3:0] size;
output likely_out;
output [7:0] codeword;
output done_flush;
// The following are LUTs that do not change
// they may be synthesized into hardwired logic
reg     [14:0]  advance [0:60];
reg     [5:0]   next_m[0:61*8-1];
reg     [5:0]   next_1[0:61*8-1];
reg     [4:0]   split[0:61*8-1];
reg             first[0:61*8-1];
reg     [7:0]   split_5 to 8[0:31];
// the FSM state must be kept as both a 6-bit index and
// as 8-bit "start of valid codespace interval" and
// "stop of valid codespace interval"
reg     [5:0]   fsm_state;
reg     [7:0]   start;
reg     [7:0]   stop;
// Control for flushing
reg     [3:0]   left;
wire    [3:0]   sel;
wire    [7:0]   next_start;
wire    [7:0]   next_stop;
wire    [3:0]   sz;
wire    [7:0]   cw;
wire    [5:0]   next_state;
wire    [7:0]   split8;
wire    [4:0]   split5;
wire            fps;
wire            top_split;
wire            likely;
bits_on bo (.bits(advance[fsm_state] & (15'h7FFF >> (15-pclass))),
    .num(sel));
cw_gen cwg (.start((likely ~^ fps) ? start : split8),
    .stop((likely ~^ fps) ? (split8 - 8'h01) : stop),
    .codeword(cw), .size(sz), .next_start(next_start),
    .next_stop(next_stop));
// behavioral
assign size = flush ? 1 : sz;
assign codeword = flush ? 0 : cw;
assign done_flush = (left == 0);
assign likely_out = likely;
assign next_state = do_next_state(sel, likely,
    next_m[{fsm_state, sel[2:0]}],
    next_1[{fsm_state, sel[2:0]}]);
assign split5 = do_split5(sel, split[{fsm_state, sel[2:0]}]);
assign split8 = split_5 to 8[split5];
assign fps = (sel >= 8) ? 1 : first[{fsm_state, sel[2:0]}];
assign top_split = (codestream >= split8) ? 1 : 0;
assign likely = encode ? likely_in : fps ^ top_split;
always @ (posedge clock)
    if (enable)
        begin
            fsm_state = next_state;
            start = next_start;
            stop = next_stop;
        end
always @ (posedge clock)
    if (flush)
        left = 0;
always @ (reset)
    begin
        fsm_state = 0;
        start = 0;
        stop = 8'hFF;
        left = 1;
    end
// Helper function for bit_generate to determine next state.
// State 0 uses many split points, while the last 4 (6_16, 10_16, 1B_16,
// and 38_16) are handled with special logic here.
function [5:0] do_next_state;
    input [3:0] sel;
    input likely;
    input [5:0] next_m;
    input [5:0] next_1
    begin : do_next_state_f
        if (sel >= 8)
            begin
```

```
                if (likely)
                    case (sel)
                        8: do_next_state = 6;
                        9: do_next_state = 16;
                        10: do_next_state = 27;
                        11: do_next_state = 56;
                    endcase
                else
                    do_next_state = 0;
            end
        else
            begin
                do_next_state = likely ? next_m :
next_1;
            end
    end
endfunction
// Helper function for bit_generate to determine split point in
// 5 bit form.
// State 0 uses a lot of split points, the last 4 are handled with
// special logic here.
function [5:0] do_split5;
    input [3:0] sel;
    input [5:0] split;
    begin
        do_split5 = (sel >= 8) ? sel + 20 : split;
    end
endfunction
endmodule // bit_generate
```

Determining Number of Bits On

Bits on unit 904 in FIG. 9 determines the number of 1 bits with a tree of adders. An exemplary Verilog HDL description is as follows:

```
// Copyright 1997 RICOH
// Returns the number of 1 bits in the bits
module bits_on (bits, num);
    input [14:0] bits;
    output [3:0] num;
    assign num = bits[0] + bits[1] + bits[2] + bits[3] +
        bits[4] + bits[5] + bits[6] + bits[7] +
        bits[8] + bits[9] + bits[10] + bits[11] +
        bits[12] + bits[13] + bits[14];
endmodule
```

Codeword Generation

Figure 13:
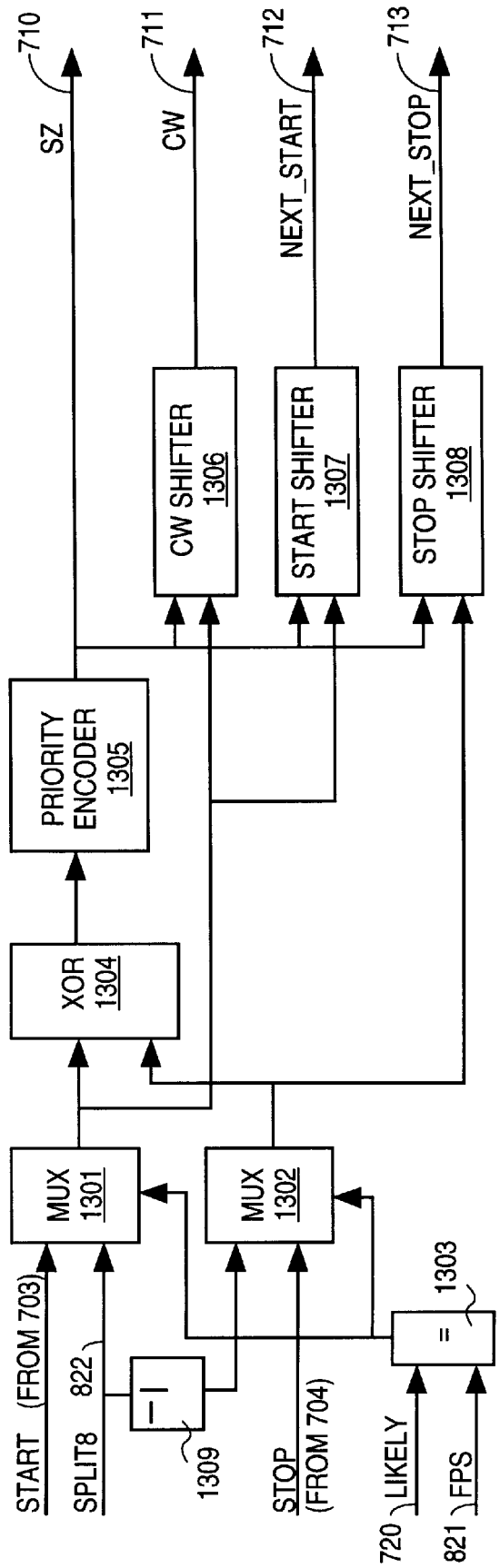
FIG. 13 is a block diagram of one embodiment of the generate codeword (cw_gen) unit of the bit generate logic of the coder of the present invention.

FIG. 13 is a block diagram of one embodiment of the generate codeword (cw_gen) unit 805 of bit generate logic 701. As discussed above, codeword unit 805 generates codeword and performs this function in logic instead of in a LUT, thereby providing hardware savings.

Referring to FIG. 13, generate codeword unit 805 comprises MUX 1301 which is coupled to receive the start value from start value register 703 and split8 value 822. A subtractor 1309 subtracts 1 from the split8 value 822. MUX 1302 is coupled to receive the output of subtractor 1309 on its first input and the stop value from stop value register 704 on second input. The outputs of MUXs 1301 and 1302 are selected via a select signal output from comparator 1303 which is coupled to receive likely indication 720 and fps signal 821 and asserts the output on the select signal if the two are equal, thereby selecting the start value to be output from MUX 1301 and split8 value 822 minus 1 to be output from MUX 1302. If not asserted, the split8 value 822 is output from MUX 1301 and the stop value is output from MUX 1302.

The output of MUX 1301 is coupled to one input of XOR gate 1304 to codeword shifter 1306 and start shifter 1307. The output of MUX 1302 is coupled to the other input of XOR 1304 and to one input of stop shifter 1308. The output of XOR gate 1304 is coupled to the input of priority encoder 1305. The output of priority encoder 1305 is sz indication (e.g., signal(s)) 710 that is output from generate codeword unit 805. The sz indication 710 is also coupled to the other input of each of codeword shifter 1306, start shifter 1307 and stop shifter 1308. The outputs of codeword shifter 1306, start shifter 1307 and stop shifter 1308 are the cw (codeword) 711, next_start value 712, and the next_start 713.

The current valid interval between the start and stop values is divided at the value specified by split8 value 822. Comparator 1303 performs a comparison between likely indication 720 and fps 821 to determine whether either the start or stop values is replaced by the split value indicated by split8 value 822 to create a new interval (new start and stop values). In one embodiment, if the stop value is replaced, it is replaced with the split value minus one. The new start and stop values are exclusive ORed (XORed) by XOR 1304 to locate bits that match. The number of matching bits, starting with the MSB, is determined by priority encoder 1305 and output as the size of the codeword (sz indication 710). The size of the codeword controls shifters 1306–1308. The matching bits of the new start and stop values are output by cw shifter 1306 as cw 711. The bits that do not match are output by start shifter 1307 and stop shifter 1308 as next_start 712 and next stop 713 respectively. Start shifter 1307 fills the LSB(s) of the lower and of the interval with 0's. Stop shifter 1708 fills the LSB(s) of the upper endpoint of the interval with 1's. In some embodiments, this requires shifting and ORing (see verilog).

Note that in alternative embodiments two or all three of these shifters can be combined. Also note that cw shifter 1306 can use the new stop value as an input instead of the new start value.

An exemplary Verilog HDL description of FIG. 13 is given below.

```
//Copyright 1997 RICOH
//generate a codeword
module cw_gen (start, stop, codeword, size, next_start, next_stop);
    input [7:0]start;
    input [7:0]stop;
    output [7:0]codeword;
    output [3:0]size;
    output [7:0]next_start;
    output [7:0]next_stop;
    //these registers are only needed for behavioral simulation
    reg [7:0]cw;
    reg [3:0]sz;
    assign codeword = cw;
    assign size = sz;
    assign next_start = start << size;
    assign next_stop = (stop << size) | (8'hFF >> (8-size));
    always @ (start or stop)
        begin
        casex (start ^ stop)
            8'b1xxxxxxx: begin
                sz = 0;
                cw = 0;
            end
            8'b01xxxxxx: begin
                sz = 1
                cw = start >> 7;
            end
            8'b001xxxxx: begin
                sz = 2
                cw = start >> 6;
            end
```

-continued

```
            8'b0001xxxx: begin
                sz = 3;
                cw = start >> 5;
            end
            8'b00001xxx: begin
                sz = 4;
                cw = start >> 4;
            end
            8'b000001xx: begin
                sz = 5;
                cw = start >> 3;
            end
            8'b0000001x: begin
                sz = 6;
                cw = start >> 2;
            end
            8'b00000001: begin
                sz = 7;
                cw = start >> 1;
            end
            8'b00000000: begin
                sz = 8;
                cw = start;
            end
        endcase
    end
endmodule
```

Table 4 summarizes the valid start and stop pairs that represent the 61 FSM states. These start and stop pairs and no others are generated by the operation of the hardware.

TABLE 4

Valid Start and Stop Pairs (hexadecimal).

| stop | start | | | |
|---|---|---|---|---|
| 83 | 70 | | | |
| 87 | 00 | 70 | 60 | 40 |
| 8b | 70 | 60 | | |
| 8f | 00 | 70 | 60 | 40 |
| 97 | 00 | 60 | | |
| 9b | 00 | 60 | | |
| 9f | 00 | 60 | 40 | |
| a7 | 00 | 40 | 70 | |
| ab | 00 | | | |
| af | 00 | 70 | 40 | 64 |
| b7 | 00 | 70 | 40 | |
| bb | 00 | 70 | | |
| bd | 00 | | | |
| bf | 00 | 70 | 40 | |
| c7 | 00 | 40 | | |
| cb | 00 | | | |
| cf | 00 | 40 | | |
| d7 | 00 | 40 | | |
| db | 00 | | | |
| df | 00 | 40 | | |
| e7 | 00 | | | |
| ef | 00 | 40 | 60 | 20 |
| f7 | 00 | 40 | 60 | |
| fb | 00 | 40 | | |
| fd | 00 | | | |
| fe | 00 | | | |
| ff | 00 | 40 | 60 | 20 |

Bit Packing

Figure 14:
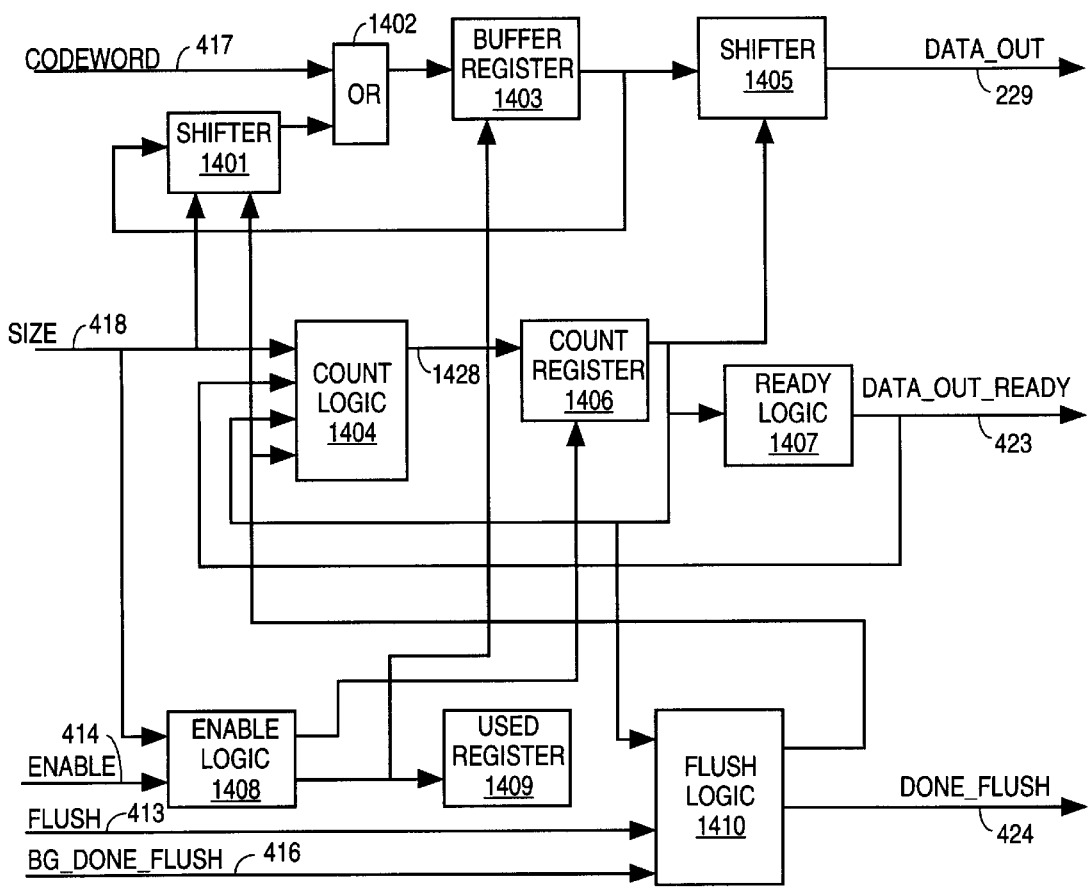
FIG. 14 is a block diagram of one embodiment of the pack unit of the entropy coder of the present invention.

FIG. 14 is a block diagram of one embodiment of pack unit 404 of entropy coder 400. Pack unit 404 combines variables length codewords into bytes when encoding. The clock and enable signals are not shown to avoid obscuring the present invention.

Referring to FIG. 14, codeword 417 is coupled to one input of OR gate 1402 which ORs it with the output of shifter 1401. The results of the ORing operation are stored in buffer register 1403. Buffer register (bbuf) 1403 holds bits until they assembled into bytes and output. In one embodiment, buffer register 1403 is a 16-bit buffer. When input data is received, the data currently in buffer register 1403 is shifted using shifter 1401 to make room for the new data and the new data is added. To flush at the end of decoding, any data currently in buffer register 1403 is shifted to complete a byte. The data output from buffer register 1403 is coupled to the input shifter 1405. Shifter 1405 aligns the contents buffer register 1403 according to the value of count register 1406 to generate the data output, data_out 229. For example, assuming there are 9 bits in buffer register 1403 in positions 8 . . . 0, the count in count register 1406 is 9, and bits 8 . . . 1 are to be output, shifter 1405 aligns these 8 bits to the bits 7 . . . 0 of data_out 229. Bit 0 of buffer register 1403 remains until the next byte can be output.

Figure 14A:
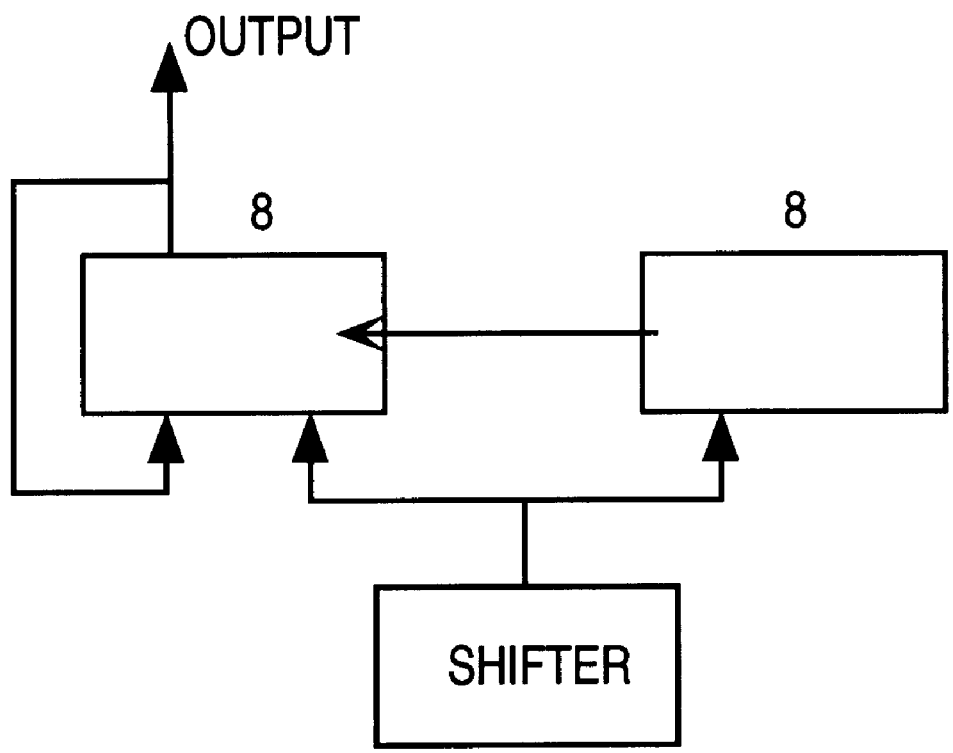
FIG. 14A is a block diagram of an alternative embodiment of packing logic.

Alternatively, a single shifter could be used instead of two shifters. The single shifter would align the data on the input to buffer register 1403. Buffer register 1403 would be implemented as two 8-bit registers that could shift by 8 as each byte was output. An example of such an implementation is shown in FIG. 14A.

Buffer register 1403 stores data in response to the output of enable logic 1408 which is coupled to receive the size indication 418 and enable indication 414. Enable logic 1408 asserts its enable output when the size greater than 0 in the enable that is asserted. The enable output for enable logic 1408 is coupled to an input of used register 1409 to indicate that bits have been sent. The output of buffer register 1403 is fed back to shifter 1401 to be combined with the shifted data.

Count register (bcnt) 1406 keeps track of the bits in the buffer register 1403 that are waiting to be output. Count register 1406 is incremented by the size of the input data minus a particular amount based on whether data_in ready signal 1428 is asserted. If asserted, the count in count register 1406 is incremented by the size of the input data minus 8; otherwise, the count is incremented by the size of the input data (minus 0). Count logic 1404 (which is coupled to receive size indication 418, a feedback of data_out_ ready signal 423, a feedback from count register 1406 and the output of flush logic 1410) is responsible for asserting data_in_ready signal 1428. In one embodiment, count register 1406 comprises a 4-bit counter.

Ready logic 1407 monitors when the output of count register 1406 is 8 or more and asserts data_out_ready signal 423. When this occurs, count logic 1404 decrements the count in count register 1406 by 8.

Flush logic 1410 is used to flush, or output, any data still being buffered at the end of coding. In one embodiment, flush logic 1410 flushes count logic 1404 and shifter 1401 in response to flush signal 413 and bg_done_flush signal 416. Flush logic 1410 is also coupled to receive the output of used register 1409 and the output of count register 1406. Used register (bused) 1409 is set to 1 when any data is input. In one embodiment, used register 1409 is a 1-bit register. It is used to indicate when no data has been input so flushing is not necessary. Flush logic 1410 performs the flushing operation if flush signal 413 is asserted, the value in count register 1406 is greater than 0, and the value in used register 1409 is greater than zero. Thus, if used register 1409 indicates that no data has been input, flushing logic 1410 indicates that flushing is complete. To flush, if data-out-ready 423 is not asserted, then the contents of buffer register 1403 are moved to the MSB(s) using shifter 1401 and the contents of count register 1406 are set to equal to 0 or 8 depending on whether the data_out_ready signal 423 is asserted or not, respectively. Flushing is well known in the art.

After this flushing is complete, flush logic 1419 asserts done_flush signal 424. In other words, if the flush signal 415 is asserted and either the count in count register 1406 is zero or the value is used register 1409 is zero, then done_ flush signal 424 is asserted.

If the FSM_coder is being reset, buffer register 1403, count register 1406 and used register 1409 are initialized. In one embodiment, they are initialized to 0.

An Exemplary Verilog HDL description for FIG. 14 follows below.

```
// Copyright 1997 RICOH
// pack variable length codewords into 8-bit codestream bytes
module pack(clock, reset, data_in, size, enable, flush,
     data_out, data_out_ready, done_flush);
  input clock;
  input reset;
  input [7:0] data_in;
  input [3:0] size;
  input enable;
  input flush;
  output [7:0] data_out;
  output data_out_ready;
  output done_flush;
  reg [15:0]bbuf;
  reg [3:0]bcnt;
  reg       bused; /* keep track so if no data out, don't flush */
  wire      ready;
  assign ready = bcnt >= 8;
  assign data_out = (bbuf >> (bcnt-8));
  assign data_out_ready = ready;
  assign done_flush = flush & ((bcnt == 0) || (bused == 0));
  //normal operation
  always @ (posedge clock)
      if (enable)
         begin
            if (size > 0)
               begin
                  bused = 1;
                  bbuf = (bbuf << size) | data_in;
               end
            bcnt = bcnt + size - (ready ? 8:0);
         end
  //flush buffered data at end of coding
  always @ (posedge block)
      if (flush && (bcnt > 0) && (bused))
         begin
            if (!ready)
               bbuf = (bbuf << (-bcnt));
            if (bcnt=0)
               bcnt=0:
            else if (bcnt<8)
               bcnt=8
            else if (bcnt==8)
               bcnt=0;
            else
               bcnt=bcnt-8;
         end
   always @ (reset)
      if (reset)
         begin
            bbuf=0;
            bcnt=0;
            bused=0;
         end
endmodule
```

Bit Unpacking

Figure 15:
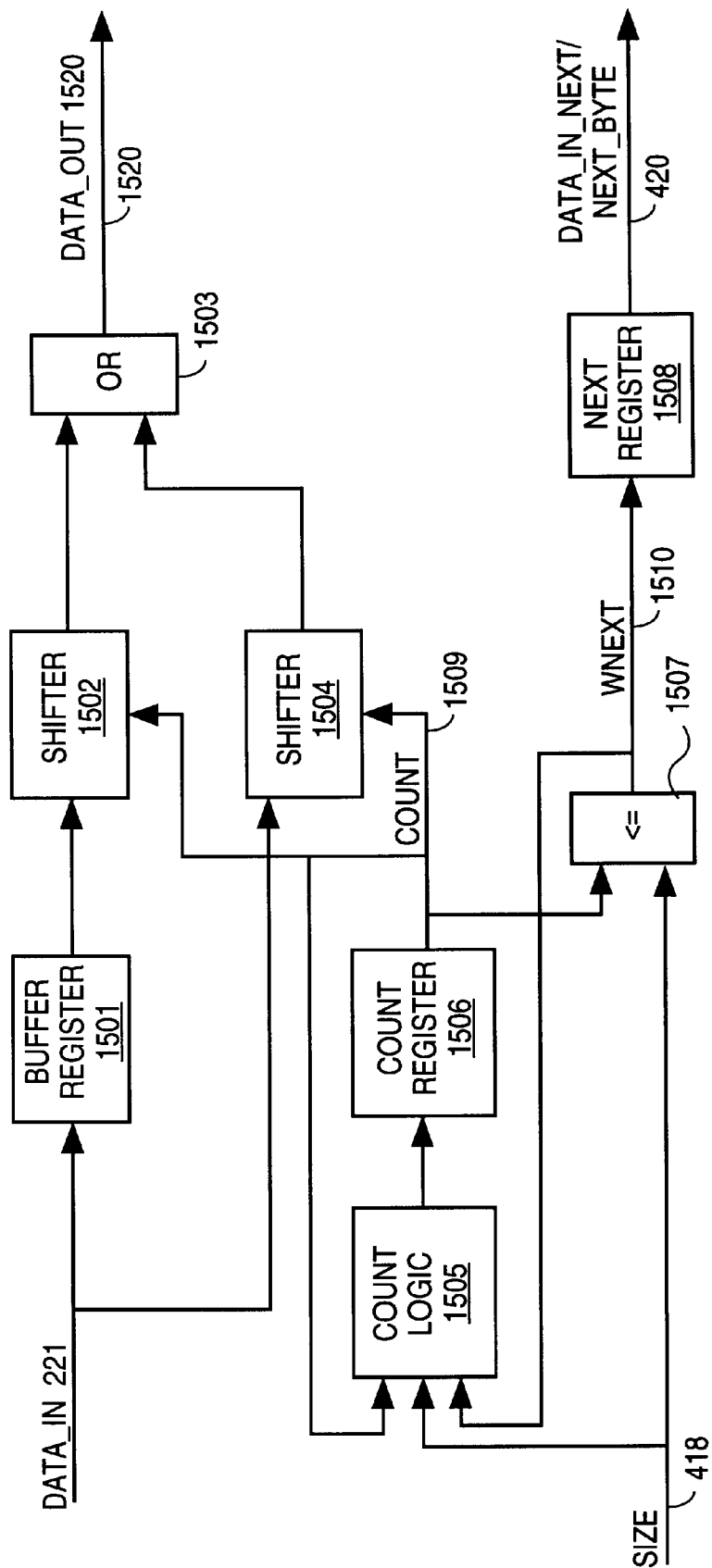
FIG. 15 is a block diagram of one embodiment of the unpack unit.

FIG. 15 is a block diagram of one embodiment of unpack unit 405 that performs variable length shifting of the bytes of the coded data stream into variable length codewords during decoding. The clock 405, reset signal 411 and enable signal 414 are not shown to avoid obscuring the present invention.

Referring to FIG. 15, data_in_codeword 221 is coupled to the input of buffer register 1501 and shifter 1504. Buffer register (ubuf) 1501 holds a previous number of bits of the coded data. In one embodiment, buffer register 1501 is an 8_bit register that holds the previous 8-bits of coded data.

The output of buffer register 1501 is coupled to the input of shifter 1502 which shifts the data to one input of OR gate 1503 in response to the output of count register 1506. The other input to OR gate 1503 is coupled to the output of shifter 1504 which shifts the data_in 221 in response to count 1509 output from count register 1506. The output of OR gate 1503 is the data_out 1520, which is codestream 419.

Count register 1506 outputs count 1509 in response to an input of count logic 1505. Count logic 1505 generates its output in response to count 1509 fed back from the output of count register 1506, size indication 418 and the output of comparator 1507. The other input to comparator 1507 is coupled to count 1509. The output of comparator 1507, wnext signal 1510, is coupled to the input of next register 1508. The output of next register 1508 is the next_byte signal 420.

Count register (ucnt) 1506 holds the number of bits in buffer register 1501 that have not been consumed by the decoder. Count register 1506 is decremented via count logic 1505 by the size of the codeword consumed by the decoder as indicated by size indication 418. When the value in count register 1506 is less than or equal to the size of the currently requested codeword, the data_in 221 is loaded into buffer register 1501, count register 1506 is incremented by 8 and wnext signal 1510 is asserted.

The properly aligned codestream, data_out 1520, is generated by taking the number of bits equal to count 1509 (count register 1506) from buffer register 1501 and a number of bits equal to 8 minus the number of bits equal to count 1509 from data_in 221. Comparator 1507 is a less-than-or-equal-to comparator that determines if count 1509 is less than or equal to size indication 418. If it is, wnext signal 1510 is asserted. In response to wnext signal 1590 being asserted, next register (next) 1508 generates the next byte control indication 420, which indicates that the next byte of the coded data stream should be presented at data_in 221. In one embodiment, register 1508 is a 1-bit signal. In other words, when the first of two bytes is consumed, next byte indication 420 indicates that the next byte of data_in 221 should be input.

If the FSM-coder is being reset, buffer register 1501, count register 1506 and next register 1508 are all initialized. In one embodiment, these registers are all initialized to 0. Note that registers 1501, 1506 and 1508 may be implemented as other types of storage devices.

Below is an exemplary Verilog HDL description for FIG. 15.

```
// Copyright 1997 RICOH
// unpack the 8-bit codesteam bytes into variable length codewords
// data_in is passed directly through to data_out, so it must be
// registered elsewhere
module unpack (clock, reset, data_in, size, enable,
        data_out, next_byte);
    input clock;
    input reset;
    input [7:0] data_in;
    input [3:0] size;
    input enable;
    output [7:0] data_out;
    output next_byte;
    reg [7:0]ubuf;
    reg [3:0]ucnt;
```

```
    reg     next;
    wire            wnext;
    assign data_out = (data_in >> ucnt) | (ubuf << (8-ucnt));
    assign wnext = (ucnt <= size); // need to get more data
    assign next_byte = next;
    always @ (posedge clock)
        begin
            if (enable)
                begin
                    if (wnext)
                        ubuf = data_in;
                    ucnt = ucnt - size + (wnext ? 8 : 0);
                    next = wnext;
                end
        end
    always @ (reset)
        begin
            if (reset)
                begin
                    ubuf = 0;
                    ucnt = 0;
                    next = 0;
                end
        end
endmodule
```

FSM Coder Control

Figure 16:
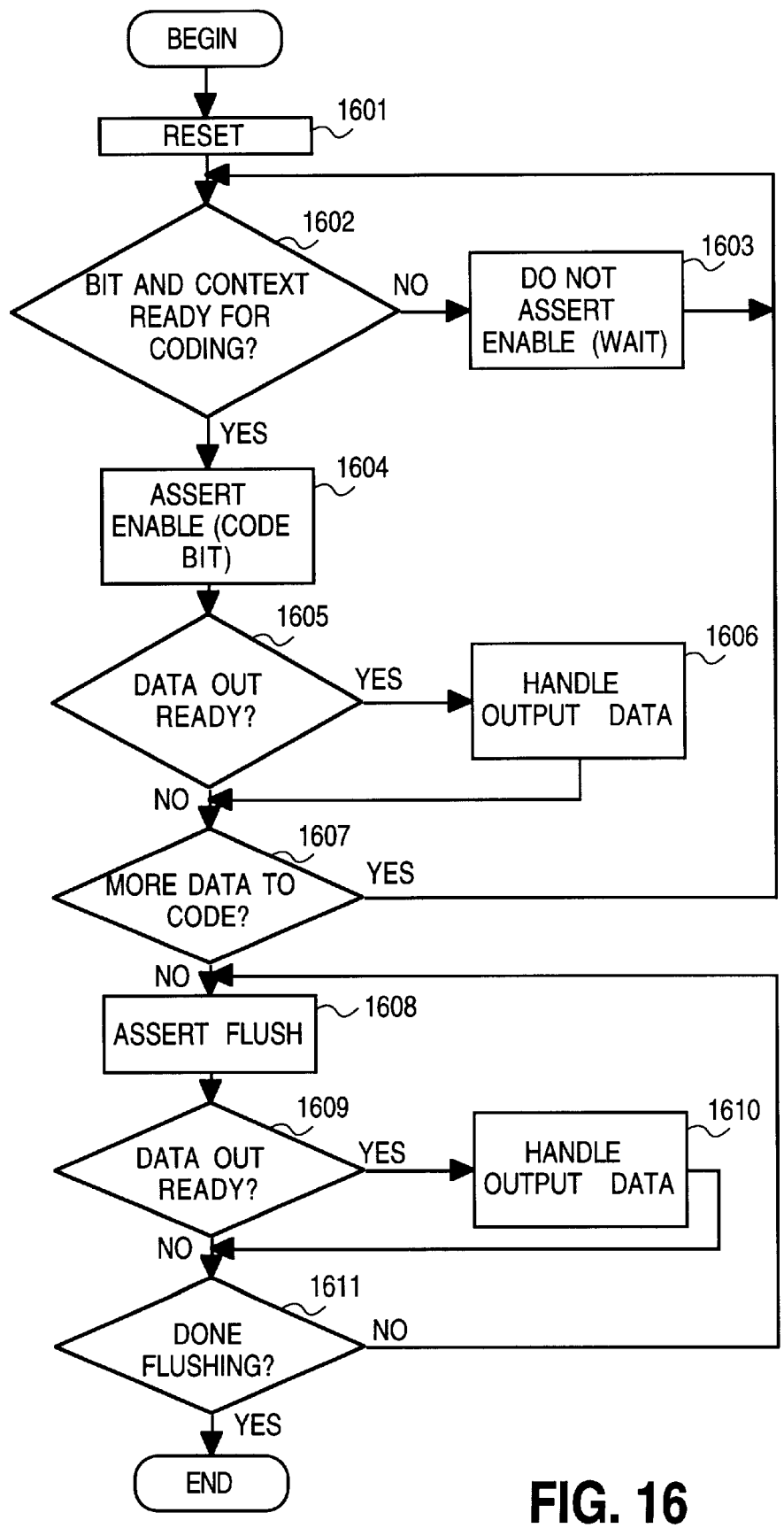
FIG. 16 is a control flowchart for encoding.
Figure 17:
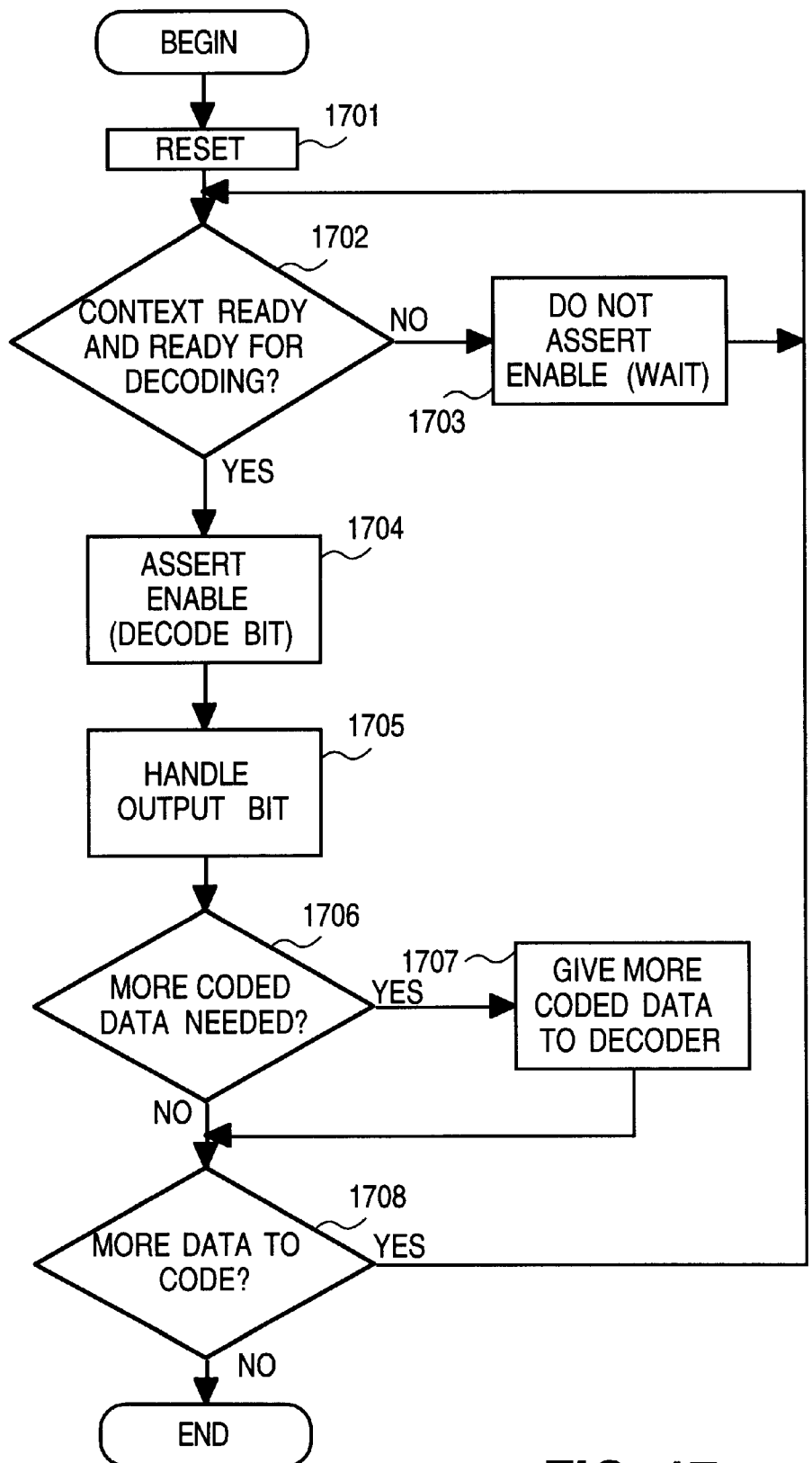
FIG. 17 is a control flowchart for decoding.

FIG. 16 is a control flowchart for encoding. FIG. 17 is the corresponding flowchart for decoding. The control is performed by processing logic which may be hardware, software or a combination of both. In one embodiment, the processing logic comprises a computer system with one or more processors executing instructions.

Referring to FIG. 16, the control flow chart for encoding begins by processing logic performing a reset (processing block 1601). After performing a reset, processing logic tests whether the bit and context are ready for coding (processing block 1602). If the bit and context are not ready for coding, processing continues at processing block 1603 where processing logic does not assert an enable indication (e.g., signal(s)) and processing loops back to the beginning of processing block 1602. If the bit and context are ready, processing continues to processing block 1604 where processing logic asserts the enable indication to code the bit.

After asserting the enable indication, processing logic tests whether the data output is ready (processing block 1605). If the data output is ready, processing logic handles the output data at processing block 1606 and processing continues to processing block 1607. Such handling may include delivery to storage, a channel, a display, processing, or whatever uses the data. If processing logic determines that the data is not ready to be output, processing continues to processing block 1607 where processing logic determines if there is more data to be coded. If there is more data to be coded, processing loops back to processing block 1602; otherwise processing continues at processing block 1608.

At processing block 1608, processing logic asserts the flush indication (e.g., signal(s)). Thereafter, processing logic tests whether data is ready to be output (processing block 1609). If the data is ready to be output, processing continues at processing block 1610 where processing logic handles the output data and processing continues to processing block 1611. If the data is not ready to be output, processing continues to processing block 1611 as well. At processing block 1611, processing logic tests whether flushing has completed. If flushing has not completed, the processing logic loops back to processing block 1608. If the flushing has been completed, the control flow for encoding ends.

Referring to FIG. 17, the control flow for decoding begins at processing block 1701 where processing logic resets the FSM coder. After resetting the FSM encoder, processing logic tests whether the context is ready and the coder is ready for decoding (processing block 1702). A synchronous system is always ready, while an asynchronous system requests bits of decoded data and/or system waits for coded data. If the context is not ready or the coder is not ready for decoding, processing continues at processing block 1703 where processing logic does not assert the enable indication and processing loops back to the beginning of processing block 1702. On the other hand, if the context is ready and the decoder is ready for decoding, processing continues to processing block 1704 where processing logic asserts the enable indication to begin decoding the bit. After asserting the enable indication, processing logic handles the output bit (processing block 1705). This handling may include delivering the decoded data to whatever is to use it, such as a storage, a channel, a display, processing, etc. After handling the output bit, processing logic tests whether there is more coded data needed (processing block 1706). If more coded data is needed, processing logic gives more coded data to the decoder (processing block 1707) and processing continues to processing block 1708. On the other hand, if more coded data is not needed, processing transitions directly to processing block 1708. At processing block 1708, processing logic tests whether there is more data to decode. If there is more data to decode, processing logic loops back to processing block 1702. If there is no more data to be coded, the control flow for decoding ends.

The Verilog shows the operations in detail and also contains some initialization specific to simulation.

```
//
// test FSM
module system( );
    parameter SIZE = 413*2;
    reg clock;
    reg reset;
    reg enable;
    reg flush;
    reg bit_in;
    reg [9:0] context;
    reg encode;
    reg [7:0] data_in;
    wire [7:0] data_out;
    wire data_out_ready;
    wire done_flush;
    wire bit_out;
    wire reset_done;
    wire data_in_next;
    coder cd(.clock(clock), .reset(reset), .bit_in(bit_in),
        .context(context), .data_in(data_in), .encode (encode),
        .enable(enable), .flush(flush);
        .reset_done(reset_done), .bit_out(bit_out),
        .data_out(data_out),
        .data_out_ready(data_out_ready), .data_in_next(data_in_next),
        .done_flush(done_flush));
    reg [9:0] testdata[0:SIZE-1];
    reg [7:0] codeddata[0:SIZE-1];
    integer i;
    integer cd;
    initial
        begin
            // initialize FSM code LUTs
            $readmemh("advance.hex",cd.bg.advance);
            $readmemh("next_m.hex", cd.bg.next_m);
            $readmemh("next_1.hex", cd.bg.next_1);
            $readmemh("split.hex", cd.bg.split);
            $readmemh("first.hex", cd.bg.first);
            $readmemh("split58.hex", cd.bg.split_5to8);
            //test data from small.ras
            $readmemh("small.bit", testdata);
                #5 reset = 1; clock = 0; enable = 0; flush = 0; bit_in = 0;
```

-continued

```
            context = 0; encode = 1; data_in = 0;
            #5 reset = 0; enable = 0;
            while (!reset_done)
                begin
                    #10 clock = 0;
                    #10 clock = 1;
                end
            #5 enable = 1;
            cd = 0;
            for (i=0;i<SIZE;i = i + 2)
                begin
                    #5 clock = 0;
                    bit_in = testdata [i+1];
                    context = testdata[i];
                    if (data_out_ready)
                        begin
                            codeddata[cd]= data_out;
                            cd = cd +1;
                        end
                    #5 clock = 1;
                end
            #5 clock = 0;
                enable = 0;
            #5 clock = 1;
            #5 clock = 0;
            #5 clock = 1;
            #5 clock = 0;
                flush = 1;
            #5 clock = 1;
            while (!done_flush)
                begin
                    #5 clock = 0;
                    if (data_out_ready)
                        begin
                            codeddata[cd] = data_out;
                            cd = cd + 1;
                        end
                    #5 clock = 1;
                end
            // output the result of encoding
            for (i=0;i<cd;i = i +1)
                begin
                    $write ("%h",codeddata[i]);
                    if (i%16 == 15) $display("");
                end
            $display ("");
            // decode
            #5 reset = 1; clock = 0; enable = 0; flush = 0; bit_in = 0;
            context = 0; encode = 0; data_in = 0;
            #5 reset = 0; enable = 0;
            while (!reset_done)
                begin
                    #10 clock = 0;
                    #10 clock = 1;
                end
            #5 enable = 1; data_in = codeddata [0];
            cd = 0;
            for (i=0;i<SIZE;i = i + 2)
                begin
                    #5 clock = 0;
                    context = testdata[i];
                    #5 clock = 1;
                    if (bit_out != testdata[i + 1])
                        begin
                            $display ("ERROR: Decoder did not match
                                encoder !!!", bit_out);
                            $finish;
                        end
                    if (data_in_next)
                        begin
                            cd = cd + 1;
                            data_in = codeddata[cd];
                        end
                end
            #10 $finish;
        end
endmodule
```

Parallelization and Pipelining

The present invention may be implemented with parallelization and pipelining. Either of these increase the maximum clock speed and allow coding of more than one bit per clock cycle. However, pipelining and parallelization is made difficult due to the amount of logic in feedback loops. The context memory and the fsm_state, along with the start and stop registers, must be updated for every bit before the next context. For decoding, many context models also require receiving the previously decoded bit before the next context, creating another feedback loop. These feedback loops require some operations to be sequential, thereby complicating parallelism.

In one embodiment, the hardware design given above processes one bit per clock cycle. Other compression applications require many bits to be coded for each pixel in an image; thus, many clock cycles are required. The actual number of clock cycles per component of each pixel depends on the depth of the image and the image content. It is desirable either to process more than one bit per clock cycle and/or to have a clock rate that is significantly faster than the pixel clock.

The present invention provides for FSM-coders with true parallelism. For example, two bits (with associated contexts) can be coded in one cycle. In such a case, the context model generates two contexts in parallel. The bitstream, context memory and the fsm_state, and the start and stop registers are updated as if the two bits were coded sequentially. The bit generate logic could be modified to handle two PCLASSs. This would require a significant increase in hardware complexity. For example, the codeword generate unit would need to handle two split values, effecting both start and stop and would have to generate up to 16-bit codewords. Handling two bits or more at a time could be simplified if only special cases were handled. The normal mode of one-bit-at-a-time operation would be used when the special case was not applicable. Here are some examples:

Code one bit in any PCLASS and one bit in PCLASS 0 only.

Code two bits, both in PCLASS 0.

Code four bits, all in PCLASS 0.

Code two bits in any PCLASS, but only when starting in FSM-state 0.

The hardware cost of true parallelism or context models that do not allow for parallel context generation may make true parallelism unattractive.

An alternative to true parallelism is to have different FSM-coders process different portions of the coded bitstream independently. A particularly attractive option is to pipeline a single physical FSM-coder so it operates several independent virtual FSM-coders. Once opportunities for pipelining are exhausted, then FSM-coders (or un-pipelineable portions of FSM-coders) can be replicated for parallel operation. There are many ways to divide the bitstream into portions for parallel coding:

For video, different frames can be coded in parallel.

The image can be broken into tiles and different tiles can be coded in parallel.

If the image has multiple components (such as RGB, CMYK or YUV), different components can be coded in parallel.

Figure 10:
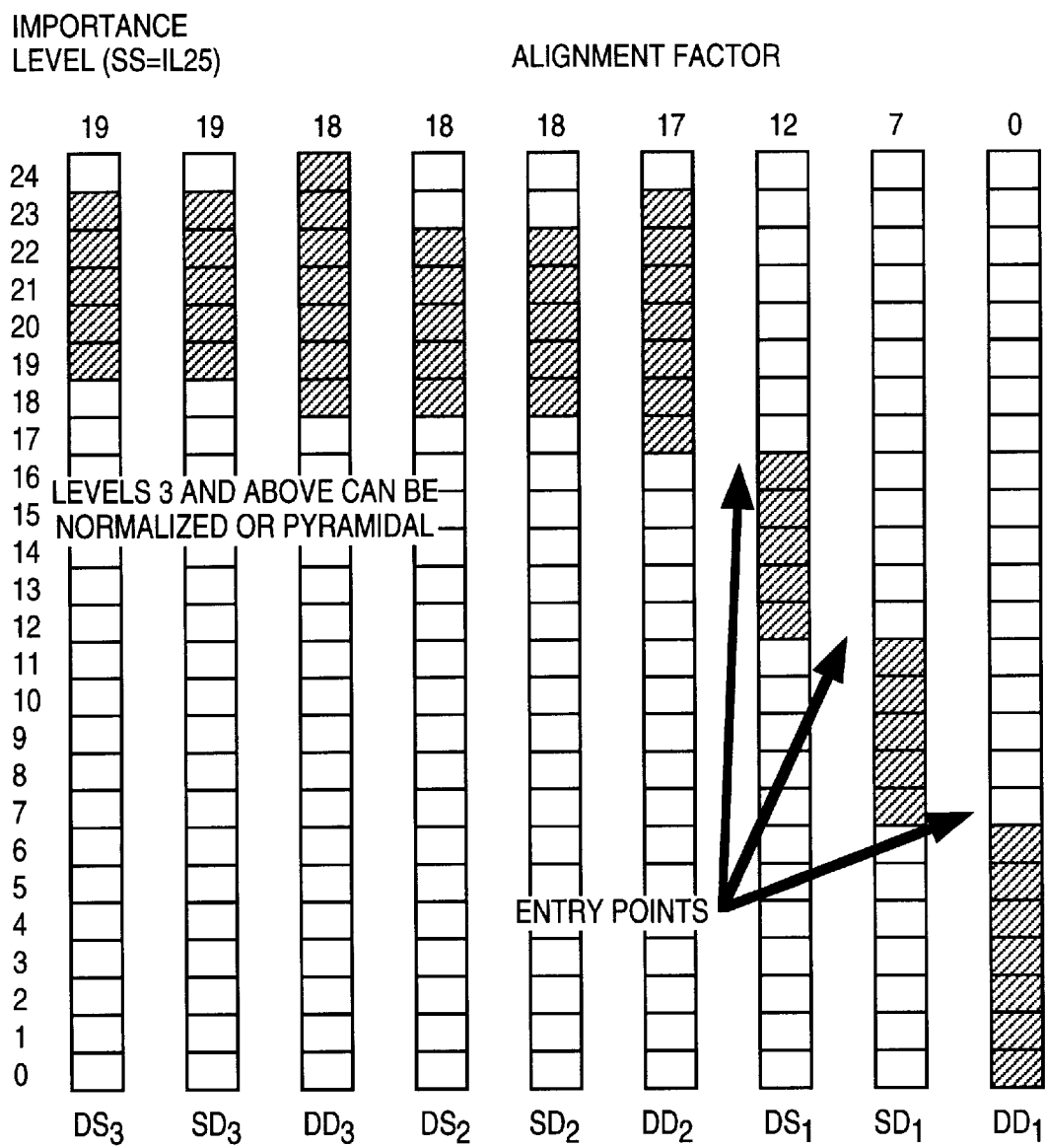
FIG. 10 illustrates an exemplary alignment for wavelet coefficients.

There may be places within a tile/component where the FSM-coder is reset, referred to herein as entry points. Segments of coded data starting at different entry points may be coded in parallel. For wavelet coefficients, it may be convenient to use custom alignment such as that shown in FIG. 10. Coefficients are divided into four groups of equal size (since the $DS_1$, $SD_1$ and $DD_1$ frequency bands, each are one-fourth the total number of coefficients). (Equal size means an equal number of coefficients, while the number of total bits or total binary decisions in each group may differ). Levels other than 1 can be aligned in a normalized or pyramidal fashion. If only encoding in parallel is desired, contexts can be generated in parallel. For decoding in parallel, the context model must not require data not yet decoded. For the alignment of FIG. 18, coding the level 1 coefficients without conditioning on parents may be necessary.

To achieve a high degree of parallelism, several of the above ways to divide the data may be used in the same implementation. Unfortunately, all of these ways limit flexibility in some way to achieve high speed. A single image, with a single tile, a single component and no entry points (other than at the start of coded data for the title) cannot be coded in parallel.

There are several places where the FSM-coder could be broken to pipeline stages, for example:

between the context model and the FSM-coder, after the context memory, after probability state expansion, after the generation of the sel value, after state expansion.

To generate a valid wavelet codestream when multiple independent FSM-coders are used, the coded data is re-ordered. Output from each coder is buffered independently when encoding. After coding is complete, the buffers is output to the codestream at the proper places. For decoding, each coder accesses a different portion of the codestream.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the various embodiments are not intended to limit the scope of the claims which in themselves recite only those features regarded as essential to the invention.

Thus, finite state machine (FSM)-coder has been described.

We claim:

1. A method of encoding comprising:

creating an interval based on a finite state machine (FSM) state, wherein the interval comprises a pair of subintervals having endpoints;

selecting one of the pair of subintervals based on whether the input bit is in a most probable state;

outputting zero or more bits corresponding to bits that match between endpoints of said one subinterval that occur from the most significant bits to, and not including, the first non-matching bits between the endpoints of said one subinterval.

2. The method defined in claim 1 wherein creating an interval comprises selecting a value at which to split the interval into the pair of subintervals.

3. The method defined in claim 1 wherein a first one of the pair of subintervals is associated with a most probable symbol and a second one of the pair of subintervals is associated with a least probable symbol.

4. An apparatus for encoding comprising:

means for creating an interval based on a finite state machine (FSM) state, wherein the interval comprises a pair of subintervals having endpoints;

means for selecting one of the pair of subintervals based on whether the input bit is in a most probable state;

means for outputting zero or more bits corresponding to bits that match between endpoints of said one subinterval that occur from the most significant bits to, and not including, the first non-matching bits between the endpoints of said one subinterval.

5. The apparatus defined in claim 4 wherein the means for creating an interval comprises means for selecting a value at which to split the interval into the pair of subintervals.

6. The apparatus defined in claim 4 wherein a first one of the pair of subintervals is associated with a most probable symbol and a second one of the pair of subintervals is associated with a least probable symbol.

7. An apparatus for encoding comprising:

a first logic unit to create an interval based on a finite state machine (FSM) state, wherein the interval comprises a pair of subintervals having endpoints;

a second logic unit to select one of the pair of subintervals based on whether the input bit is in a most probable state and to output zero or more bits corresponding to bits that match between endpoints of said one subinterval that occur from the most significant bits to, and not including, the first non-matching bits between the endpoints of said one subinterval.

8. The apparatus defined in claim 7 wherein a first one of the pair of subintervals is associated with a most probable symbol and a second one of the pair of subintervals is associated with a least probable symbol.

9. The apparatus defined in claim 8 further comprising an indication coupled to the second logic unit to indicate which one of the pair of subintervals is associated with the most probable symbol.

10. The apparatus defined in claim 9 wherein the indication comprises a signal.

11. The apparatus defined in claim 7 wherein the first logic unit selects a value at which to split the interval into the pair of subintervals.

12. A method of encoding a plurality of bits, said method comprising:

specifying an interval, for each one of the plurality of bits, having two subintervals and each of the two subintervals having a pair of endpoints;

selecting, for said each one bit, one of the two subintervals of each interval based on which of the two subintervals is associated with a most probable symbol and whether said each one bit is the same as the most probable symbol; and outputting zero or more bits for each interval, wherein the zero or more bits correspond to bits that match between a pair of endpoints of the selected subinterval that occur from the most significant bits to, and not including, the first non-matching bits between the endpoints of said one subinterval.

13. The method defined in claim 12 wherein the second split index value is obtained based on the FSM state and a first value.

14. The method defined in claim 13 further comprising:

generating a mask based on a probability class;

obtaining a second value from a table based on the FSM state;

ANDing the mask and the second value to create a result; and creating the first value based on the result.

15. The method defined in claim 14 wherein creating the first value comprises counting ones in the result to create a count, wherein the count comprises the first value.

16. The method defined in claim 12 wherein which of the two subintervals is associated with the most probable symbol is indicated from a generated signal.

17. The method defined in claim 12 further comprising:

comparing said each one bit to a the most probable symbol indication; and asserting a likely indication if said each one bit matches the most probable symbol indication.

18. The method defined in claim 12 further comprising:

obtaining a first split index value from a first table;

obtaining a second split index value from a second table using the first split index value.

19. The method defined in claim 12 further comprising shifting non-matching bits to the left to the most significant bit locations and filing any less significant bits with either a 0 bit or a 1 bit based on whether the endpoint in the subinterval is a lower bound or upper bound respectively.

* * * * *